United States Patent
Lewin et al.

(10) Patent No.: US 7,545,966 B2
(45) Date of Patent: Jun. 9, 2009

(54) EFFICIENT METHODS FOR RECONSTRUCTION AND DEBLURRING OF MAGNETIC RESONANCE IMAGES

(75) Inventors: Jonathan S. Lewin, Baltimore, MD (US); Hisamoto Moriguchi, Cleveland, OH (US); Jeffrey L. Duerk, Avon Lake, OH (US); Brian M. Dale, Cary, NC (US)

(73) Assignee: Case Western Reserve University, Cleveland, OH (US)

( * ) Notice: Subject to any disclaimer, the term of this patent is extended or adjusted under 35 U.S.C. 154(b) by 572 days.

(21) Appl. No.: 10/840,412

(22) Filed: May 5, 2004

(65) Prior Publication Data

US 2005/0074152 A1 Apr. 7, 2005

Related U.S. Application Data

(60) Provisional application No. 60/485,823, filed on Jul. 8, 2003, provisional application No. 60/483,219, filed on Jun. 27, 2003, provisional application No. 60/468,177, filed on May 5, 2003.

(51) Int. Cl.
    *G06K 9/00* (2006.01)
(52) U.S. Cl. .................. 382/128; 382/154; 382/280
(58) Field of Classification Search .......... 382/128, 382/154, 280
    See application file for complete search history.

(56) References Cited

U.S. PATENT DOCUMENTS

| 4,746,864 A | 5/1988 | Satoh |
| 5,270,653 A | 12/1993 | Pauly |
| 5,402,067 A | 3/1995 | Pauly et al. |
| 5,498,960 A | 3/1996 | Vinegar et al. |
| 5,539,313 A | 7/1996 | Meyer |

(Continued)

FOREIGN PATENT DOCUMENTS

EP  0950902 A2  10/1999

(Continued)

OTHER PUBLICATIONS

Cheng-Tie Chen, M. Ibrahim Sezab, and A. Mural Tekalp; Effects of constraints, initialization, and finite-word length in blind deblur by convex projections; Acoustics, Speech, and Signal Processing, IEEE; vol. 12, Apr. 1987, pp. 1201-1204.*

(Continued)

*Primary Examiner*—Wenpeng Chen
*Assistant Examiner*—Eueng-Nan Yeh

(57) ABSTRACT

Methods are described for efficient reconstruction of MRI data. In one practice, new reconstruction algorithms for non-uniformly sampled k-space data are presented. In the disclosed algorithms, Iterative Next-Neighbor re-Gridding (INNG) and Block INNG (BINNG), iterative procedures are performed using larger rescaled matrices than the target grid matrix In BINNG algorithm, the sampled k-space region is partitioned into several blocks and the INNG algorithm is applied to each block. In another practice, a novel partial spiral reconstruction (PFSR) uses an estimated phase map from a low-resolution image reconstructed from the central k-space data and performs iterations, similar to the iterative procedures with INNG, with an imposed phase constraint. According to yet another practice, an off-resonance correction is performed on matrices that are smaller than the full image matrix. All these methods reduce the computational costs while rendering high-quality reconstructed images.

4 Claims, 15 Drawing Sheets

U.S. PATENT DOCUMENTS

| | | | |
|---|---|---|---|
| 5,652,516 | A | 7/1997 | Adalsteinsson et al. |
| 6,016,057 | A | 1/2000 | Ma |
| 6,020,739 | A | 2/2000 | Meyer et al. |
| 6,084,408 | A | 7/2000 | Chen et al. |
| 6,215,306 | B1 | 4/2001 | Tsai et al. |
| 6,459,922 | B1 | 10/2002 | Zhang |
| 6,486,670 | B2 | 11/2002 | Heid |
| 6,515,477 | B1 * | 2/2003 | Tasaka et al. ............... 324/309 |
| 6,583,623 | B1 | 6/2003 | Kwok et al. |
| 6,603,990 | B2 | 8/2003 | Zhang et al. |
| 6,995,560 | B2 | 2/2006 | Duerk et al. |
| 7,042,215 | B2 | 5/2006 | Moriguchi et al. |
| 2001/0026157 | A1 | 10/2001 | Heid |
| 2003/0060697 | A1 | 3/2003 | Zhang et al. |
| 2004/0114791 | A1 * | 6/2004 | Atkinson ................... 382/131 |
| 2005/0017717 | A1 * | 1/2005 | Duerk et al. ................ 324/307 |
| 2005/0033153 | A1 | 2/2005 | Moriguchi et al. |
| 2006/0013459 | A1 * | 1/2006 | Katscher et al. ............ 382/131 |

FOREIGN PATENT DOCUMENTS

| | | |
|---|---|---|
| WO | 2004/086060 A2 | 10/2004 |
| WO | 2004/097387 A2 | 11/2004 |

OTHER PUBLICATIONS

Desplanques et al.; "Iterative Reconstruction of Magnetic Resonance Images From Arbitrary Samples in k-space"; IEEE transactions on nuclear science, vol. 49, No. 5, Oct. 2002, 2268-2273.*

Sutton et al.; "Fast, Iterative Image Reconstruction for MRI in the Presence of Field Inhomogeneities"; IEEE transactions on medical imaging, vol. 22, No. 2, Feb. 2003; 178-188.*

Kwok, W.E., et al., "Interleaved Water and Fat Dual-Echo Spin Echo Imaging With Intrinsic Chemical-Shift Elimination," Journal of Magnetic Resonance Imaging, 13:318-323, Jan. 16, 2001.

Noll, D.C. et al., "Deblurring for Non-2D Fourier Transform Magnetic Resonance Imaging" Magnetic Resonance in Medicine 25, Jun. 1992 pp. 319-333.

King, K.F. et al., "Concomitant Gradient Field Effects in Spiral Scans" Magnetic Resonance in Medicine 4, Jan. 1, 1999 pp. 103-112.

Irarrazabal, P. et al., "Inhomogeneity Correction Using An Estimated Linear Field Map" Magnetic Resonance in Medicine 35, Feb. 1996, pp. 278-282.

Nayak, K. S. et al., "Efficient Off-Resonance Correction for Spiral Imaging" Magnetic Resonance in Medicine 45, Mar. 2001, pp. 521-524).

Man, L-C et al., "Multifrequency Interpolation for Fast Off-resonance Correction" Magnetic Resonance in Medicine 37, May 1997, pp. 785-792.

Glover, G. H. et al., "Three-Point Dixon Technique for True Water/Fat Decomposition with B0 Inhomogeneity Correction" Magnetic Resonance in Medicine 18, Apr. 1991, pp. 371-383.

Meyer, C. H. et al., "Fast Spiral Coronary Artery Imaging," Magnetic Resonance in Medicine 28, Dec. 1992, pp. 202-213.

Kwok, W.E., et al., "Interleaved Water and Fat Dual-Echo Spin Echo Imaging With Intrinsic Chemical-Shift Elimination," Journal of Magnetic Resonance Imaging, 13:318-323 (Jan. 16, 2001).

* cited by examiner b a

EFFICIENT METHODS FOR RECONSTRUCTION AND DEBLURRING OF MAGNETIC RESONANCE IMAGES

CROSS-REFERENCE TO RELATED APPLICATIONS

This application incorporates by reference in entirety, and claims priority to and benefit of, the U.S. Provisional Patent Applications having the following numbers and respective filing dates: No. 60/468,177 (filed on 5 May 2003), No. 60/483,219 (filed on 27 Jun. 2003), and No. 60/485,823 (filed on 8 Jul. 2003).

BACKGROUND

The present invention relates to magnetic resonance imaging ("MRI"). It finds particular application in conjunction with reconstruction and deblurring of MRI images.

Magnetic resonance imaging is a diagnostic imaging modality that does not rely on ionizing radiation. Instead, it uses strong (ideally) static magnetic fields, radio-frequency ("RF") pulses of energy and magnetic field gradient waveforms. More specifically, MR imaging is a non-invasive procedure that uses nuclear magnetization and radio waves for producing internal pictures of a subject. Three-dimensional diagnostic image data is acquired for respective "slices" of an area of the subject under investigation. These slices of data typically provide structural detail having a resolution of one (1) millimeter or better.

Programmed steps for collecting data, which is used to generate the slices of the diagnostic image, are known as an MR image pulse sequence. The MR image pulse sequence includes magnetic field gradient waveforms, applied along three axes, and one or more RF pulses of energy. The set of gradient waveforms and RF pulses are repeated a number of times to collect sufficient data to reconstruct the slices of the image.

For image reconstruction, the collected k-space data are typically reconstructed by performing an inverse Fourier transform (IFT). However, in certain experimental settings, such as spiral acquisition techniques and non-rectilinearly sampled data, image reconstruction is not simple and artifacts, such as blurring due to off-resonance effects have to be corrected. In addition, a large number of 2D-FFTs have to be performed if the data set is large, which may cause impractical and unacceptable delays in image processing.

It would therefore be desirable to provide more efficient methods for image reconstruction that render MR images with an image quality that is practically indistinguishable from that obtained with conventional image reconstruction methods, such as gridding algorithms and frequency-segmented off-resonance correction method used in spiral imaging.

SUMMARY OF THE INVENTION

The invention is directed to methods for efficient reconstruction and deblurring of MRI data obtained with non-rectilinearly acquired k-space data using, for example, spiral imaging.

According to one aspect, the invention is directed at a method of reconstructing a magnetic resonance image from non-rectilinearly-sampled k-space data. The method includes, (a) distributing the sampled k-space data on a rectilinear k-space grid, (b) inverse Fourier transforming the distributed data, (c) setting to zero a selected portion of the inverse-transformed data, (d) Fourier transforming the zeroed and remaining portions of the inverse-transformed data, at grid points associated with the selected portion, (e) replacing the Fourier-transformed data with the distributed k-space data at corresponding points of the rectilinear k-space grid, thereby producing a grid of updated data, (f) inverse Fourier transforming the updated data, and (g) applying an iteration of steps b through f to the inverse Fourier-transformed updated data until a difference between the inverse Fourier-transformed updated data and the inverse Fourier-transformed distributed data is sufficiently small.

According to one practice, a 2D-IFT is performed on a large rescaled matrix after k-space data are distributed without density compensation. After the initial image is reconstructed, all the matrix elements except the central N×N region are replaced by zeros. This matrix is 2D-Fourier transformed, wherein the obtained matrix is the result of a convolution of the rescaled matrix with a 2D sinc function. The matrix coordinates where the original data exist, i.e., the non-zero element locations in the rescaled matrix, the data are replaced by the original data values, and a 2D-IFT is subsequently performed on this matrix, leading to the updated reconstructed image. These procedures are repeated until the difference between the updated reconstructed image and the image at the previous iteration becomes sufficiently small.

In one practice, the aforedescribed process can be improved by applying consecutively increasing scaling factors. In an alternative practice, the acquired k-space region can be partitioned into several blocks, and the aforementioned algorithms can be applied to each block.

According to another aspect of the invention, a Fourier transform technique is used for variable density spiral (VDS) sampling. VDS trajectories acquire the central region of k-space data so that the Nyquist criterion is satisfied. However, outer k-space regions are undersampled to reduce the acquisition time. The original target grid is an N×N matrix. K-space data are distributed into a larger matrix rescaled by a factor of s. The location of each datum in the large rescaled matrix is determined by multiplying the original k-space coordinate by s. An Inverse Fourier Transform (IFT) is performed on the rescaled matrix, leading to an image matrix, with the intermediate reconstructed image appearing in the center of the N×N matrix, on which region a phase constraint is imposed. The region outside of the central N×N matrix is set to zeros, and a FT is performed on the matrix which includes the zeros, leading to a transformed matrix which is an estimate of the phase constrained raw data. Then, a data-consistency constraint is imposed on this transformed data matrix, i.e., the data where the original data exist are replaced by the original data values, and an IFT is subsequently performed, with an updated reconstructed image appearing in the central N×N matrix. The procedures are repeated until the difference between the updated image and the image at the previous iteration becomes sufficiently small.

According to one aspect, the invention is directed at a method of reconstructing a magnetic resonance image from non-rectilinearly-sampled k-space data. The method includes (a) distributing the sampled k-space data on a rectilinear k-space grid, (b) convolving the distributed data with a sinc function, (c) at least partially based on a characteristic of the sinc function, replacing a portion of the convolved data with a corresponding portion of the k-space data distributed on the rectilinear k-space grid, thereby producing a grid of updated data, and (d) applying an iteration of steps b through c to the updated data until a difference between the updated data and the distributed data is sufficiently small.

According to one practice, the invention is directed at a method of reconstructing a magnetic resonance image from non-rectilinearly-sampled k-space data. The method includes (a) distributing the sampled k-space data on a rectilinear k-space grid, (b) partitioning the k-space grid into blocks, (c) inverse Fourier transforming distributed data of at least one of the blocks, (d) setting to zero a selected portion of the inverse-transformed data in the at least one of the blocks, (e) Fourier transforming the zeroed and remaining portions of the inverse Fourier-transformed data, (f) at grid points associated with the selected portion, replacing the Fourier-transformed data with the distributed k-space data at corresponding points of the rectilinear k-space grid, thereby producing a grid of updated block data, (g) inverse Fourier transforming the updated block data; and (h) applying an iteration of steps b through g to the inverse Fourier-transformed updated block data until a difference between the inverse Fourier-transformed updated block data and corresponding inverse Fourier-transformed distributed block data is sufficiently small.

According to one practice, in a method for reconstructing deblurred spiral images, off-resonance correction proceeds block-by-block through a reconstructed image, and FFTs are performed on matrices (M×M) that are smaller than the full image matrix (N×N, with M<N). A small block region M×M is extracted and a 2D-FFT is performed on the M×M image matrix. After frequency demodulation, with the mean off-resonance frequency of the central rM×rM pixels ($0 < r \leq 1$, and r is typically 0.5.) in the M×M phase image matrix used as demodulation frequency, the M×M k-space data is subsequently 2D-inverse Fourier transformed. Only the central rM×rM pixels of the M×M deblurred image matrix are kept for the final reconstructed image to remove artifacts. This procedure is repeated until the entire scanned object is deblurred.

According to another aspect, the invention is directed at a method of reconstructing a magnetic resonance image from non-rectilinearly-sampled k-space data. The method includes (a) distributing the sampled k-space data on a rectilinear k-space grid, (b) partitioning the k-space grid into blocks, (c) convolving distributed data of at least one of the blocks with a sinc function, (d) at least partially based on a characteristic of the sinc function, replacing a portion of the convolved block data with a corresponding portion of the k-space data distributed on the rectilinear k-space grid, thereby producing a grid of updated block data, and (e) applying an iteration of steps b through d to the updated block data until a difference between the updated block data and corresponding distributed block data is sufficiently small.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

FIG. 5 shows profiles at the 34th row and 102nd column of the reconstructed images, wherein FIG. 5(a) is the basic INNG algorithm with s=8 after 30 iterations;

FIG. 5(b) is the basic INNG algorithm with s=8 after 101 iterations;

FIG. 5(c) is the facilitated INNG algorithm after a total of 30 iterations;

FIG. 5(d) is the BINNG algorithm with ($d_2$, $d_4$, $d_8$)=(0.01, 0.01, 0.001);

FIG. 5(e) is the conventional gridding algorithm with Voronoi DCF; and

FIG. 5(f) is the BURS algorithm with p=0.8;

FIG. 8(a) shows the facilitated INNG algorithm after 25 total iterations (6 and 19 iterations for s=2 and 4, respectively).

FIG. 8(b) shows the BINNG algorithm with ($d_2$, $d_4$, $d_8$)= (0.01, 0.01, 0.003);

FIG. 8(c) shows the conventional gridding algorithm with Voronoi DCF;

FIG. 8(d) shows the BURS algorithm with p=0.8;

FIG. 11(a) is an image before off-resonance correction;

FIG. 11(b) is the image using FSORC with L=12;

FIG. 11(c) is the image using BRORC with (M, r)=(8, 0.25);

FIG. 11(d) is the image using BRORC with (M, r)=(32, 0.5);

FIG. 12(a) is the image before off-resonance correction;

FIG. 12(b) is the image using FSORC with L=15; and

FIG. 12(c) is the image using BRORC with (M, r)=(32, 0.5).

DETAILED DESCRIPTION OF CERTAIN ILLUSTRATED EMBODIMENTS

Figure 1:
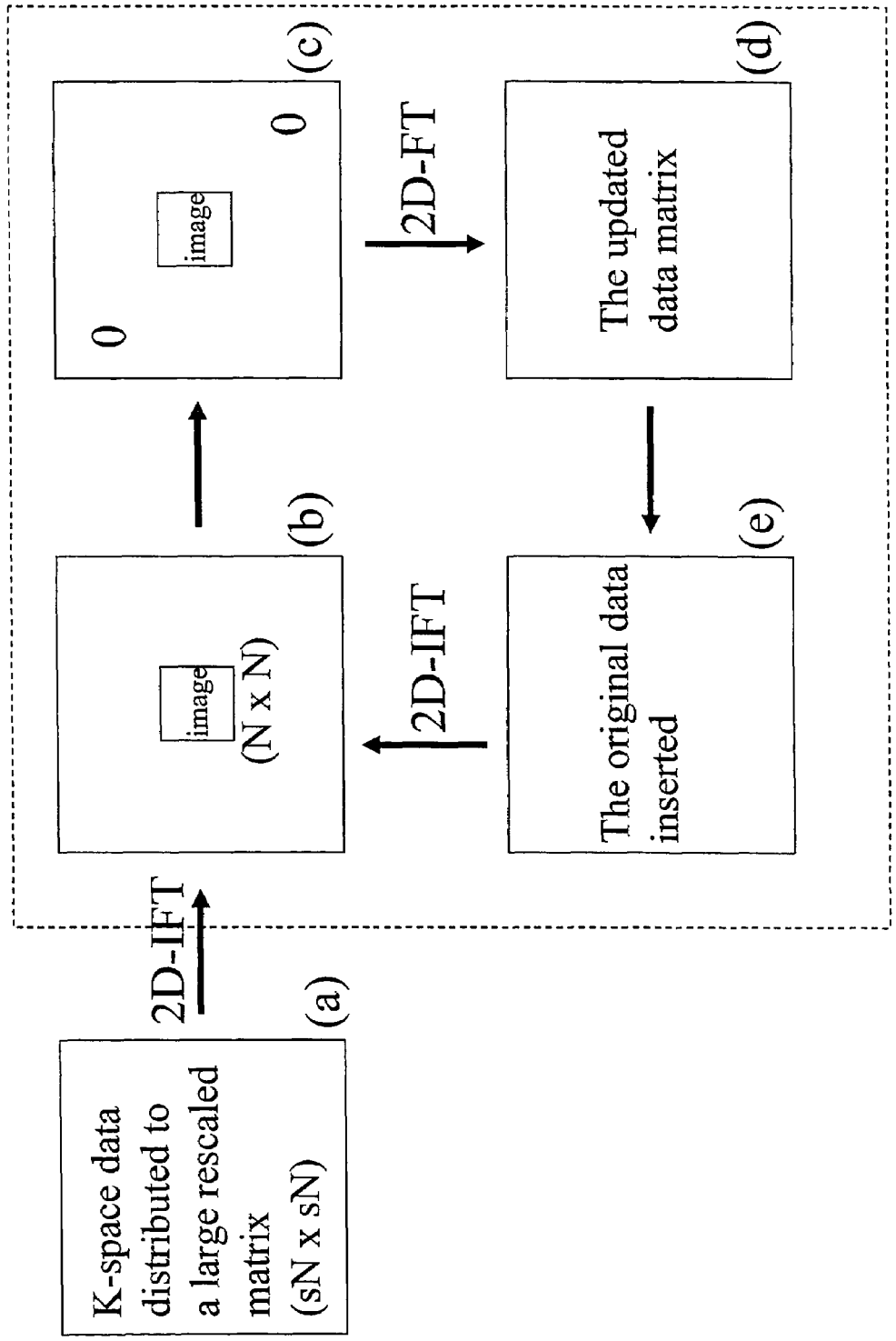
FIG. 1 is a flow chart of a basic INNG algorithm.

The methods described herein are directed, inter alia, to efficient reconstruction of high-quality MR images. In particular, the methods described herein can be applied to non-rectilinearly sampled data and spiral MRI sampling schemes.

In one exemplary practice, an approach for optimal reconstruction using rescaled matrices from non-uniformly sampled k-space data is described. Non-rectilinear data acquisition methods have advantages over rectilinear data sampling schemes and hence are often performed in magnetic resonance imaging (MRI). For example, projection reconstruction, i.e., radial trajectories, shows reduced motion artifacts, and spiral trajectories are insensitive to flow artifacts. Image reconstruction from non-rectilinearly sampled data is not simple, because 2D-Inverse Fourier Transform (IFT) cannot be directly performed on the acquired k-space data set. K-space gridding is commonly used as it is an efficient reconstruction method. Gridding is the procedure by which non-rectilinearly sampled k-space data are interpolated onto a rectilinear grid. The use of k-space gridding allows the reconstruction of images in general non-uniform sampling schemes, and thus gives flexibility to designing various types of k-space trajectories.

Conventional gridding algorithms have been proposed that are robust to noise and do not require a significant computational burden; however, a profile distortion of the reconstructed image often appears, unless the density compensation function (DCF) is sufficiently optimized. Other proposed algorithms with improved DCF's are often complicated, and it is still difficult to calculate the 'optimal DCF' in general non-uniform sampling schemes.

Another type of conventional gridding algorithm, 'Block Uniform Resampling (BURS)', requires neither a pre- nor a post-compensation step, and the reconstructed image is usually of high quality. Although the originally proposed BURS algorithm is sensitive to noise, it has demonstrated that SVD regularization techniques can avoid amplification of these data imperfections. However, it is often difficult to determine the regularization parameters in advance, as the k-space data signal-to-noise ratio (SNR) is usually unknown before reconstruction.

Another image reconstruction algorithm, known as 'Next Neighbor re-Gridding' (NNG), obviates the complicated procedures of the gridding algorithms described above. The NNG algorithm consists of the following four steps: 1) Density compensation of k-space data; 2) Distribution of the k-space data into a large rescaled matrix by a factor of s (=2m), where m is a small positive integer. The location of each datum in the large rescaled matrix is determined by rounding off the original k-space coordinate in the target rectilinear grid after multiplying it by the same factor s. If more than one datum share the same matrix coordinate, the mean value is stored; 3) IFT of the large matrix; and 4) Extraction of the original-sized matrix at the center. In brief, each acquired k-space datum is simply shifted to the closest grid point of a finer rectilinear grid than the original grid, in order to directly perform IFT on a non-uniformly sampled k-space in the NNG algorithm. The errors caused by the data shifts are usually quite small in the reconstructed image if the scaling factor s is sufficiently large. Specifically, s=4 or 8 is sufficient in practice.

As is the case with the conventional gridding algorithm, the image quality of the NNG algorithm depends on the DCF used in step 1. In other words, non-negligible profile distortions of the reconstructed image are often observed if the DCF is not well optimized.

In one embodiment, the systems and methods described herein are directed at a new image reconstruction algorithm from non-rectilinearly sampled k-space data. The newly proposed algorithm is an extension of the NNG algorithm described above and will be referred to hereinafter as the 'Iterative Next-Neighbor re-Gridding (INNG) algorithm' as it includes an iterative approach. Although the algorithm requires a number of Fast Fourier Transforms (FFTs) of rescaled matrices larger than the original-sized rectilinear grid matrix, no pre-calculated DCFs are required in the INNG algorithm, and the reconstructed image is of high quality. When the size of the rescaled matrices is significantly large, it is often impractical to perform FFTs on them. To overcome this, a 'Block INNG (BINNG) algorithm' has been developed. In the BINNG algorithm, k-space is partitioned into several blocks and the INNG algorithm is applied to each block. It will be shown that if data imperfections are non-negligible, e.g., low data SNR and/or a small scaling factor, the background noise level in the reconstructed image is increased as the iteration progresses in the INNG/BINNG algorithms. However, the rate of the increase is usually not significant unless the data imperfections are substantial. Hence, an adequate choice of stopping criteria can reconstruct a high-quality image given non-uniformly sampled k-space data. The INNG/BINNG algorithms are a simple new approach to accurate image reconstruction and an alternative to the previously-proposed optimized gridding algorithms that does not require DCFs or SVD regularization parameter adjustments.

Basic INNG Method

Referring now to FIG. 1, the basic procedures of the INNG algorithm are presented as a flow chart. Suppose that the originally-designed rectilinear grid size is N×N. The initial image of the INNG algorithm can be obtained by steps 2) and 3) in the Next-Neighbor re-Gridding (NNG) algorithm described above. In other words, a 2D-IFT is performed on a large rescaled matrix after k-space data are distributed without density compensation. These steps are shown by the process (a) to (b) in FIG. 1. After the initial image is reconstructed, all the matrix elements except the central N×N region are replaced by zeros. In FIG. 1, the process (b) to (c) represents this step. This procedure is equivalent to multiplication of the matrix (b) with a 2D-rect window function of amplitude 1 in the central N×N matrix and 0 elsewhere in the image. Therefore, if the matrix (c) is 2D-Fourier transformed, the obtained matrix (d) is the result of convolution of the matrix (a) with a 2D sinc function (which is 2D-FT of the 2D-rect function used in the previous process). After the matrix (d) is obtained, at the matrix coordinates where the original data exist in the rescaled matrix (a), the data are replaced by the original data values, as shown in the process (d) to (e) in FIG. 1. Other matrix elements are left unchanged in this process. Then, 2D-IFT is performed on the matrix (e) leading to the updated reconstructed image (b). The procedures (b)→(c)→(d)→(e)→(b) (surrounded by dashed lines in FIG. 1) are repeated until the difference between the updated reconstructed image (b) and the image (b) at the previous iteration becomes sufficiently small.

In the basic INNG algorithm, it is assumed that the Nyquist criterion is satisfied for the entire k-space region which spans from $-k_{max}$ to $+k_{max}$ along both $k_x$ and $k_y$ directions. In other words, at least one datum must exist in any s×s matrix region in the sN×sN rescaled matrix. In a practical implementation of the basic INNG algorithm, if there are non-sampled regions in the k-space, the corresponding regions in the rescaled matrix are set to zeros. For example, in spiral trajectories, k-space regions outside of the circle with a radius $|k_{max}|$ are usually not sampled. Correspondingly, the regions outside of the circle with a radius sN/2 are set to zeros in the sN×sN rescaled matrix, when the original data are inserted at each iteration. This procedure is also performed in the facilitated INNG algorithm and in the BINNG algorithm introduced in the following subsections.

The INNG algorithm described above can be classified as a well-known optimization method 'Projections Onto Convex Sets (POCS)'. In MRI, the POCS method has been used in half-Fourier reconstruction, motion correction and parallel imaging reconstruction. In the POCS method, each constraint can be formulated as a 'convex set', which is known in the art. In the INNG algorithm, two constraints are imposed on the data (or the image) at each iteration, that is, (i) the finite-support constraint and (ii) the data-consistency constraint. The constraints (i) and (ii) correspond to the process (b) to (c) and the process (d) to (e), respectively in FIG. 1. The constraints (i) and (ii) can be expressed as the following two convex sets $\Omega_1$ and $\Omega_2$, respectively:

$$\Omega_1 = \{I(x) | I(x_{out}) = 0\}, \qquad [1]$$

where I(x) is the image matrix of a large FOV (sN×sN) and $x_{out}$ represents all the matrix elements except the central N×N matrix.

$$\Omega_2 = \{I(x) | I(x) = F\{D(n)\}, D(n_{orig}) = D_{orig}(n_{orig})\}, \quad [2]$$

where F is the Fourier Transform operator, D(n) is the Fourier data matrix (sN×sN) of I(x), $n_{orig}$ represents all the elements in the larger scaled matrix where the original data exist, and $D_{orig}$ are the original data values at these coordinates.

The constraint (i) is based on the signal sampling theory in which all the sampled signals must be expressed as the summation of rectilinearly located sinc functions. If all the data values in the large rescaled matrix can be expressed as the summation of the 2D sinc functions (each of which is the FT of the 2D-rect function with amplitudes 1 in the central N×N matrix and zero elsewhere), all the image matrix elements except the central N×N region must be zeros. The need for the constraint (ii) is to keep the original data values at the original data locations for each iteration.

Suppose that the operators which project an image matrix I(x) onto $\Omega_1$ and $\Omega_2$ are $P_1$ and $P_2$, respectively. The image reconstructed using the INNG algorithm can then be expressed as:

$$I_{m+1}(x) = P_2 P_1 \{I_m(x)\}. \quad [3]$$

where the subscript of I(x) denotes the iteration number.

It can be shown that P1 and P2 satisfy the following relations:

$$\sum_x [P_1\{I_m(x)\} - P_1\{I_{m+1}(x)\}]^2 \le \sum_x [I_m(x) - I_{m+1}(x)]^2 \quad [4]$$

$$\sum_x [P_2\{I_m(x)\} - P_2\{I_{m+1}(x)\}]^2 \le \sum_x [I_m(x) - I_{m+1}(x)]^2 \quad [5]$$

where $$\sum_x$$

denotes summation of all the elements in the sN×sN image matrix. $P_1$ and $P_2$ are called non-expansive operators. The composite operator $P_2P_1$ is also non-expansive, that is, $$\sum_x [I_{m+1}(x) - I_{m+2}(x)]^2 = \sum_x [P_2 P_1\{I_m(x)\} - P_2 P_1\{I_{m+1}(x)\}]^2 \le \quad [6]$$

$$\sum_x [I_m(x) - I_{m+1}(x)]^2.$$

Note that Eqs. [4,5,6] hold whether or not the data are ideal. The algorithms with non-expansive operators have certain convergence properties. If the data distributed in the larger rescaled matrix are ideal, then the above iterative algorithm has a unique convergence point. However, if the errors contained in the data are non-negligible, a unique convergence point may not exist. Since both $P_1$ and $P_2$ are linear operators, $P_2P_1$ is also a linear operator. Thus, the reconstructed image at the m-th iteration can be expressed as the summation of the image values that originate from the ideal signal components, i.e. the signal components which satisfy the condition (i) $I_{idea,m}(x)$ and the image values that originate from the residual imperfect signal components $n_m(x)$:

$$I_m(x) = I_{ideal,m}(x) + n_m(x) (= P_2 P_1\{I_{ideal,m-1}(x)\} + P_2 P_1\{n_{m-1}(x)\}) \quad [7]$$

As the iteration continues, the first term in Eq. [7] leads to the ideal reconstructed image. The second term in Eq. [7] usually manifests itself as background noise in the reconstructed image, and the noise level is increased with iterations as will be seen in the ensuing section. However, the increased rate of the noise level is reduced as the iteration progresses. This can be understood as Eq.[6] also holds for nm(x). Therefore, it is expected that if the data SNR is within a practical range, and the scaling factor s is sufficiently large, the magnitude of $I_{ideal,m}(x)$ is still predominant over that of $n_m(x)$ after a certain number of iterations.

Exemplary stopping criteria used with this algorithm are described below, although other stopping criteria can also be used. As Eq.[6] indicates, the quantity $$\sum_x [I_m(x) - I_{m+1}(x)]^2$$

monotonically decreases with iteration number m. In the present embodiment, the sum of the squared difference $[I_m(x) - I_{m+1}(x)]^2$ is calculated within the central N×N image matrix instead of the entire sN×sN image matrix to facilitate the computation. Hence, the following quantity d is measured to determine where to stop the iteration:

$$d = \frac{\sqrt{\frac{\sum_x^{N \times N} [I_{m-1}(x) - I_m(x)]^2}{N^2}}}{\sqrt{\frac{\sum_x^{N \times N} [I_m(x)]^2}{N^2}}} = \sqrt{\frac{\sum_x^{N \times N} [I_{m-1}(x) - I_m(x)]^2}{\sum_x^{N \times N} [I_m(x)]^2}}. \quad [8]$$

where $$\sum_x^{N \times N}$$

denotes summation of the central N×N image matrix elements. The iteration is stopped if d becomes lower than a predetermined value. The predetermined stopping criterion will be denoted by $d_s$ where the scaling factor is s in the following sections.

The basic INNG algorithm described above requires a number of FFTs. Furthermore, the amount of computation for each FFT is usually demanding when a rescaled matrix is large. In the following section, a 'facilitated INNG' algorithm is described which reduces the computational load of the described INNG algorithm above.

Facilitated INNG Method

Figure 2:
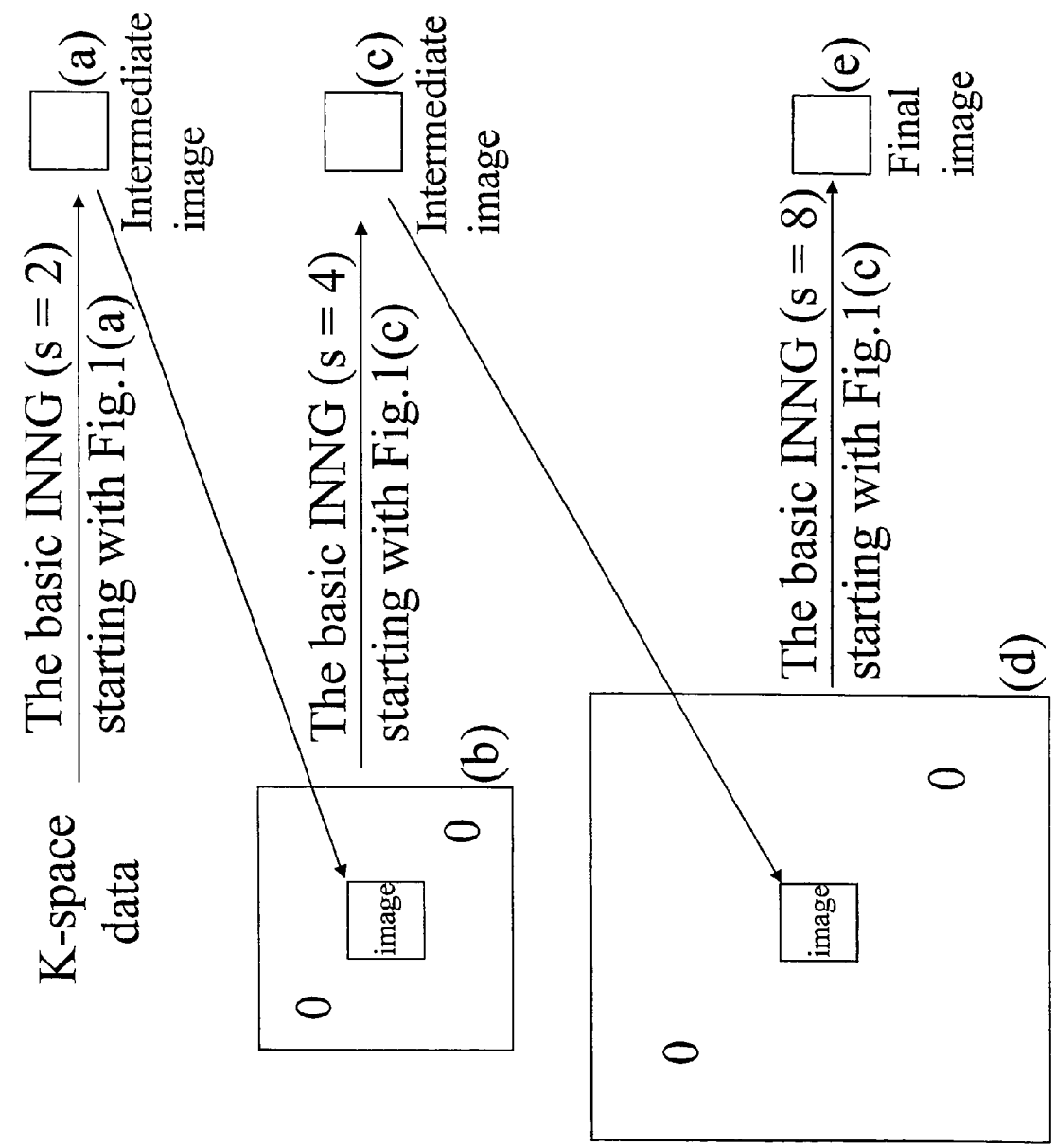
FIG. 2 is a flow chart of a facilitated INNG algorithm.

Referring now to FIG. 2, the facilitated INNG algorithm is shown in a flow chart. As seen from FIG. 2, the facilitated INNG algorithm modifies the basic INNG algorithm by employing consecutively increasing scaling factors. The first step of the facilitated INNG algorithm is the basic INNG algorithm with a small scaling factor, e.g., s=2. The image reconstructed from the basic INNG algorithm with s=2 ((a) in FIG. 2) is usually affected by noise because the errors caused by data shifts are significant. However, the image (a) is roughly close to the image reconstructed using the basic INNG algorithm with a larger scaling factor. Thus, the image (a) will be used for the basic INNG algorithm with s=4 in the next step. A 4N×4N zero matrix with the central N×N matrix replaced by the image (a) ((b) in FIG. 2) is a starting image matrix for the basic INNG algorithm with s=4. In general, this basic INNG algorithm with s=4 requires significantly fewer iterations than the same algorithm that starts with FIG. 1(a) to satisfy the same stopping criterion. To further reduce the errors caused by data shifts, the basic INNG algorithm with s=8 will be performed next, in a similar manner. In other words, the image (c) is transferred to the center of an 8N×8N zero matrix to form the matrix (d) as shown in FIG. 2 and it will be used as a starting image for the basic INNG algorithm with s=8. A scaling factor of 8 is usually sufficient in practice to reduce data shift errors.

In the facilitated INNG algorithm, an intermediate image reconstructed using one basic INNG algorithm is used as a starting image for the next basic INNG algorithm with a larger scaling factor. Although the final basic INNG algorithm must satisfy a rigorous stopping criterion, i.e., a small value of d in Eq.[8], in order to reconstruct a high-quality image, intermediate images do not have to satisfy a small d because they are merely 'estimate images' in the next basic INNG algorithm. Therefore, relaxed stopping criteria, i.e., relatively large d, can be used for all the basic INNG algorithms, with the exception of the last, in order to further improve the computational efficiency.

When the size of a rescaled matrix is significantly large, it is often impractical to perform an FFT on such a large matrix, and hence the INNG algorithms described above are difficult to implement. To address this problem, a Block INNG (BINNG) algorithm has been developed.

BINNG Method

Figure 3:
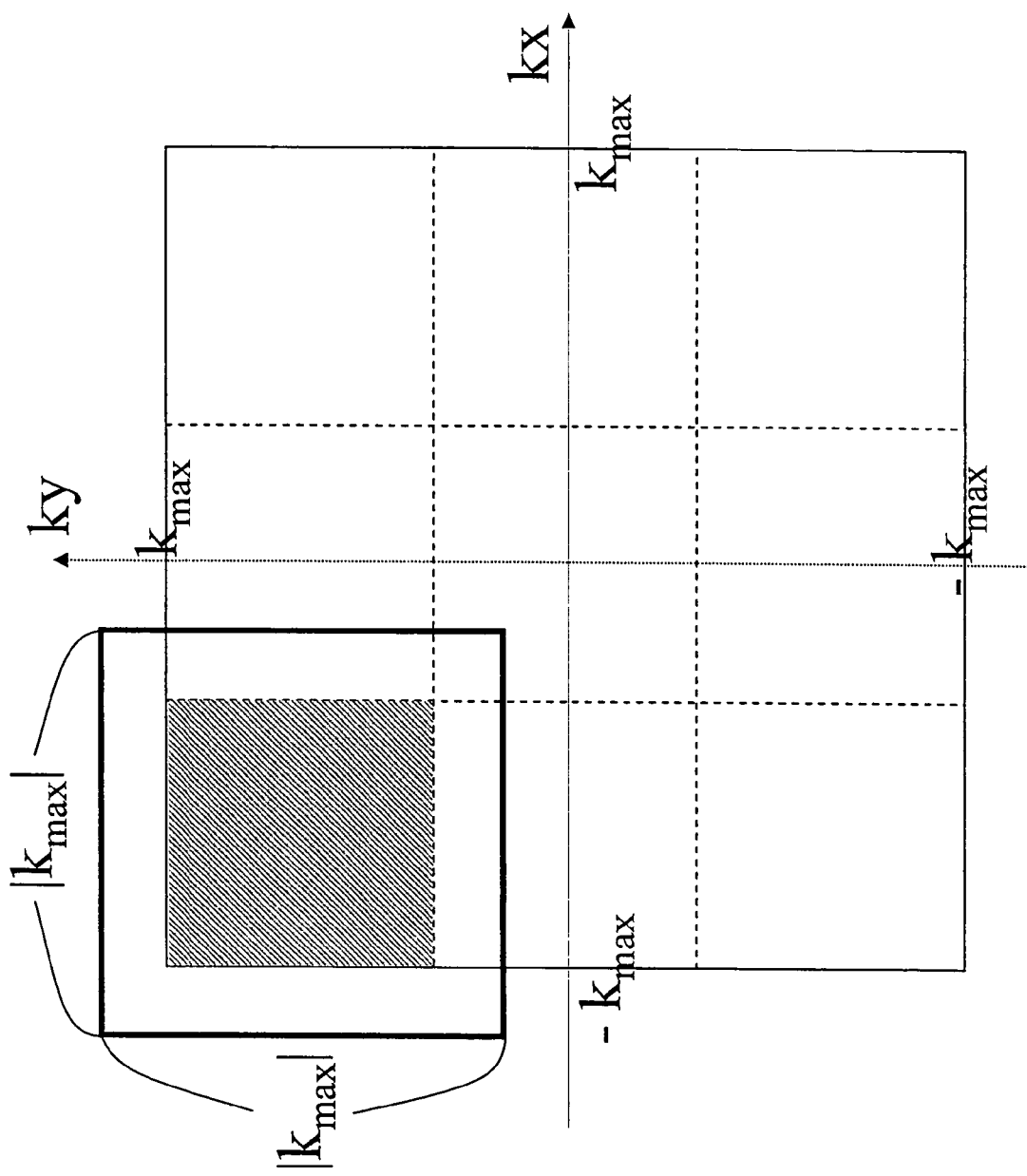
FIG. 3 is an exemplary partition scheme of a BINNG algorithm.

FIG. 3 shows an exemplary partition scheme of the BINNG algorithm. In the BINNG algorithm, the acquired k-space region is partitioned into several blocks, and the basic or facilitated INNG algorithm is applied to each block. The sampled k-space is partitioned into, for example, 3×3 blocks. All blocks do not need to be exactly the same size. In FIG. 3, the acquired k-space region is denoted as a square with its side length 2 $|k_{max}|$. Suppose that the basic INNG algorithm is applied to the shadowed block at the upper left corner in FIG. 3. When the scaling factor is s, the k-space data that are within the square with bold lines (the side length $|k_{max}|$) are distributed to an sN/2×sN/2 matrix. Zero data values are assumed for the non-sampled k-space region within the bold square.

The basic INNG algorithm is applied to the data within the bold square region using an sN/2×sN/2 matrix as though the original target grid matrix size is N/2×N/2. In other words, 2D-IFT is first performed on the sN/2×sN/2 k-space data matrix (corresponding to (a)→(b) in FIG. 1), while zeros are set outside of the central N/2×N/2 region (corresponding to (b)→(c) in FIG. 1). A 2D-FT is subsequently performed (corresponding to (c)→(d) in FIG. 1), and the original k-space data within the bold square region are inserted into the updated sN/2×sN/2 data matrix (corresponding to (d)→(e) in FIG. 1). A 2D-IFT is then performed on the sN/2×sN/2 data matrix (corresponding to (e)→(b) in FIG. 1). The above procedures are repeated until the difference between the updated matrix (b) and the matrix (b) at the previous iteration becomes sufficiently small. It is evident that an incomplete image appears in the central N/2×N/2 region in the above iterations. However, both constraints (i) and (ii) of the INNG algorithm are effectively imposed on the sN/2×sN/2 matrix at each iteration.

As is understood from the above procedures, the facilitated INNG algorithm can also be applied to the selected k-space data set by successively increasing the scaling factor. In this case, the extracted N/2×N/2 matrix is transferred to the center of the next larger rescaled matrix of zeros after each basic INNG algorithm is performed.

The obtained sN/2×sN/2 data matrix may contain non-negligible errors in the regions close to the edges as the k-space data are abruptly truncated when they are selected. Therefore, only the part of the matrix that corresponds to the originally determined block (the shadowed region in FIG. 3) may be kept from the obtained sN/2×sN/2 data matrix.

After all the 3×3 blocks are processed in a similar manner, an sN×sN k-space data matrix can be formed. It is expected that this data matrix satisfies both conditions (i) and (ii) for the entire region. In order to reconstruct an image, as applying 2D-FFT to the sN×sN data matrix is computationally impractical (original assumption), a 2D-FFT is performed on the N×N data matrix obtained by s-fold decimation of the sN×sN data matrix.

In the above example of the BINNG algorithm, the sampled k-space region is partitioned into the exemplary 3×3 blocks, and the maximum size of the rescaled matrix is reduced to sN/2×sN/2 from sN×sN required for the INNG algorithms. Other partition schemes and block sizes are also possible. For example, when the acquired k-space region is partitioned into 5×5 blocks, the maximum size of the rescaled matrix can be reduced to sN/4×sN/4.

The image reconstruction algorithms described above have been tested by reconstruction of a computer-simulated image and from physically acquired spiral data.

Computer Simulation

Figure 4:
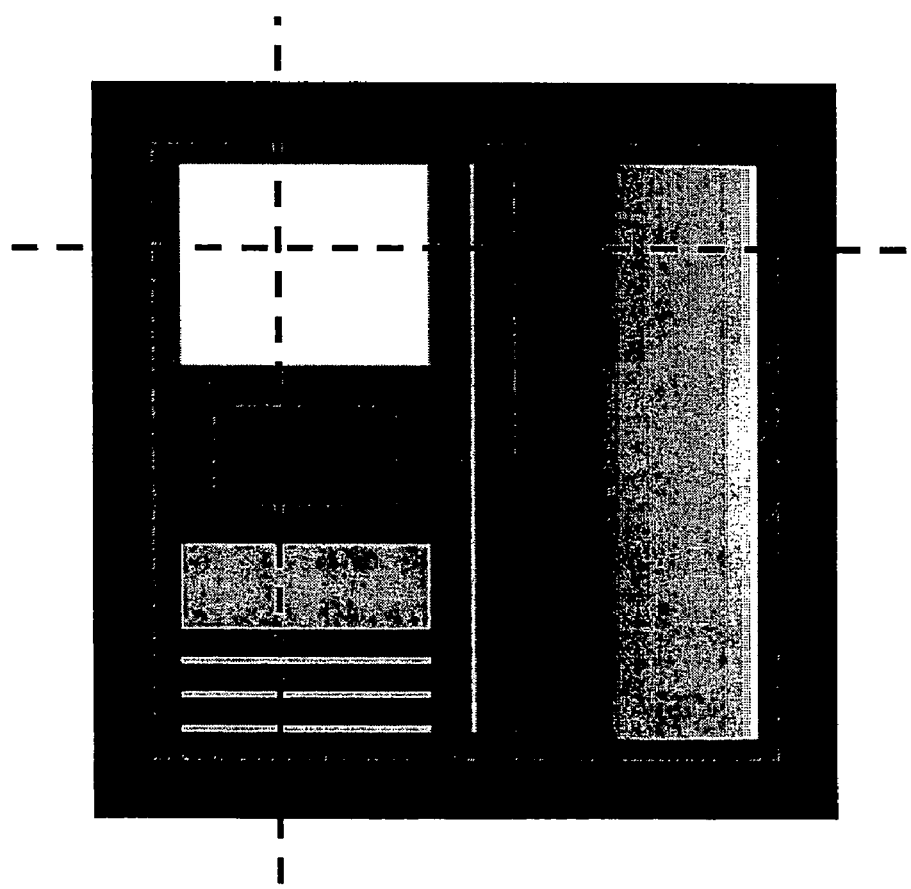
FIG. 4 is a numerical phantom used in computer simulation experiments.

Referring now to FIG. 4, a 128×128 numerical phantom was constructed and ten interleaved spiral trajectories were designed. Each trajectory sampled 1765 points consisting of simulated data and shared the central point. Noise-corrupted data were also simulated by adding Gaussian white noise to the ideal data. The mean of the noise was 0, and the standard deviation (SD) of the noise was equal to 20% of the average magnitude of the original ideal data.

Five reconstruction algorithms were used: basic INNG; facilitated INNG; BINNG; conventional gridding; and BURS (Block Uniform Re-Sampling) for both ideal and noisy data.

In the basic INNG algorithm, three different scaling factors were tested: s=2, 4 and 8. For each s, 101 iterations were performed. In the facilitated INNG algorithm, as shown in FIG. 2, the scaling factor was increased as follows: s=2→4→8. When s=2 and 4, the predetermined stopping criteria ($d_2$, $d_4$) were set to (0.01, 0.01). However, when s=8, no predetermined stopping criterion was set, and the iterations were performed until the total number of iterations were 101. In the BINNG algorithm, the simulated k-space region was partitioned into 5×5 blocks, and the facilitated INNG algorithm was performed to process each block using sN/4× sN/4 rescaled matrices. Two stopping criteria were used: ($d_2$, $d_4$, $d_8$)=(0.01, 0.01, 0.005) and (0.01, 0.01, 0.001).

In the conventional gridding algorithm, the data were convolved with a Kaiser-Bessel window (width 2.5). Two DCFs were used: the Area Density Function (ADF) and the Voronoi DCF which been shown to be well-optimized DCF. Gridding was performed onto a 2N×2N matrix to avoid amplification of aliased side lobes, and the central N×N image matrix was cropped after post-compensation.

In the BURS algorithm, truncated SVD was used for SVD regularization for both the ideal and noisy data. As truncation schemes, ⌊p×(the total number of singular values)⌋ the largest singular values were used in our computation, where p was a constant ranging from 0 to 1 and ⌊•⌋ denoted the maximum integer less than •. Values of p ranging from 0.2 to 1.0 with a 0.1 interval were tested for both the ideal and noisy data (i.e. nine images were reconstructed for each data). The radii of the data window (δκ) and the rectilinear grid window (Δk) were set to 2.0 and 4.5 (in Cartesian step), respectively.

For all the reconstructed images from both ideal and noisy data, the root mean square (RMS) errors from the original numerical phantom were measured. For all the reconstructed images from the noisy data, the image SNR ($S_{im}/N_{im}$) was also measured where $S_{im}$ and $N_{im}$ were the mean signal amplitudes of the 25×35 pixels in the upper right white rectangle and the SD of 15×10 pixels in the upper middle black rectangle, respectively. In the basic and facilitated INNG algorithms, the RMS error and the image SNR (for noisy data only) were measured for the image at each iteration.

Figure 5:
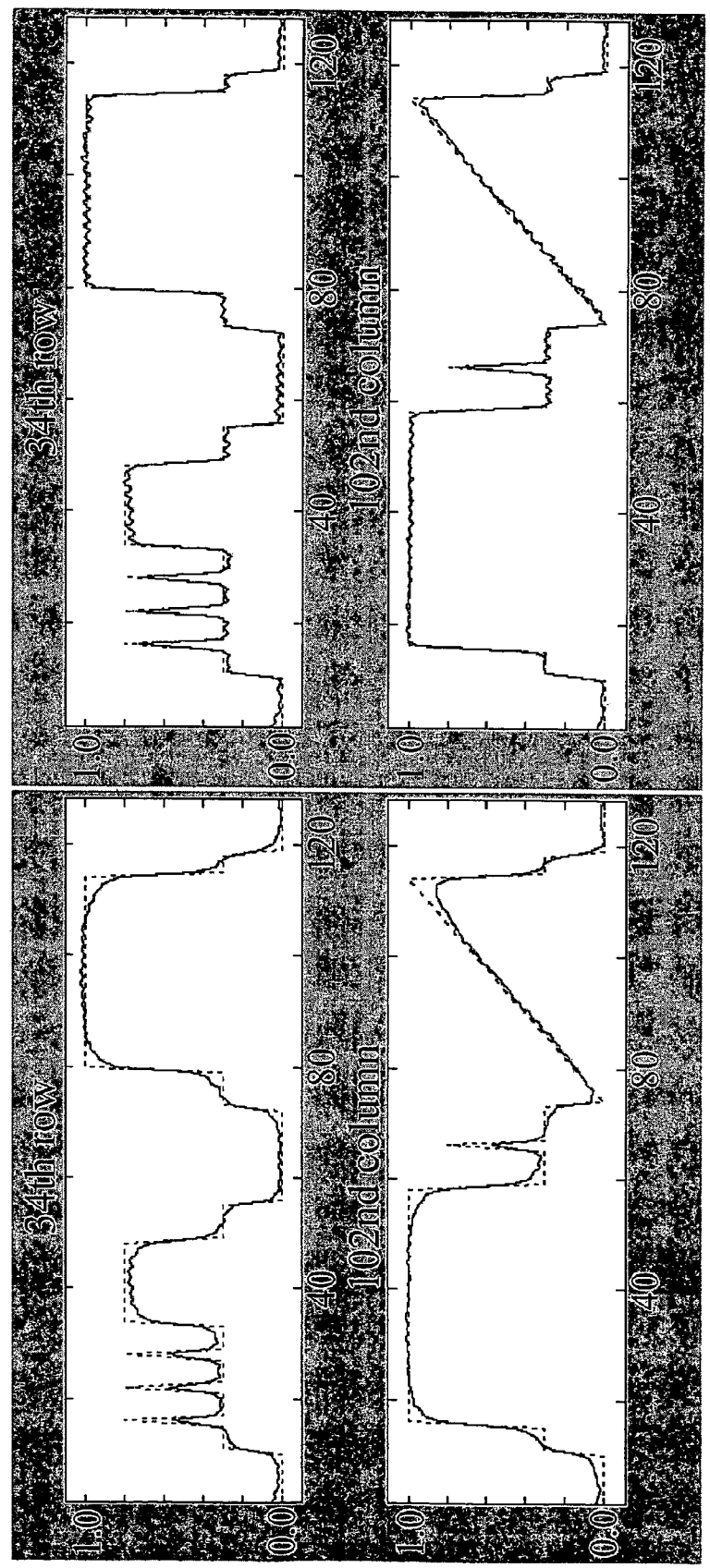
Figure 5:
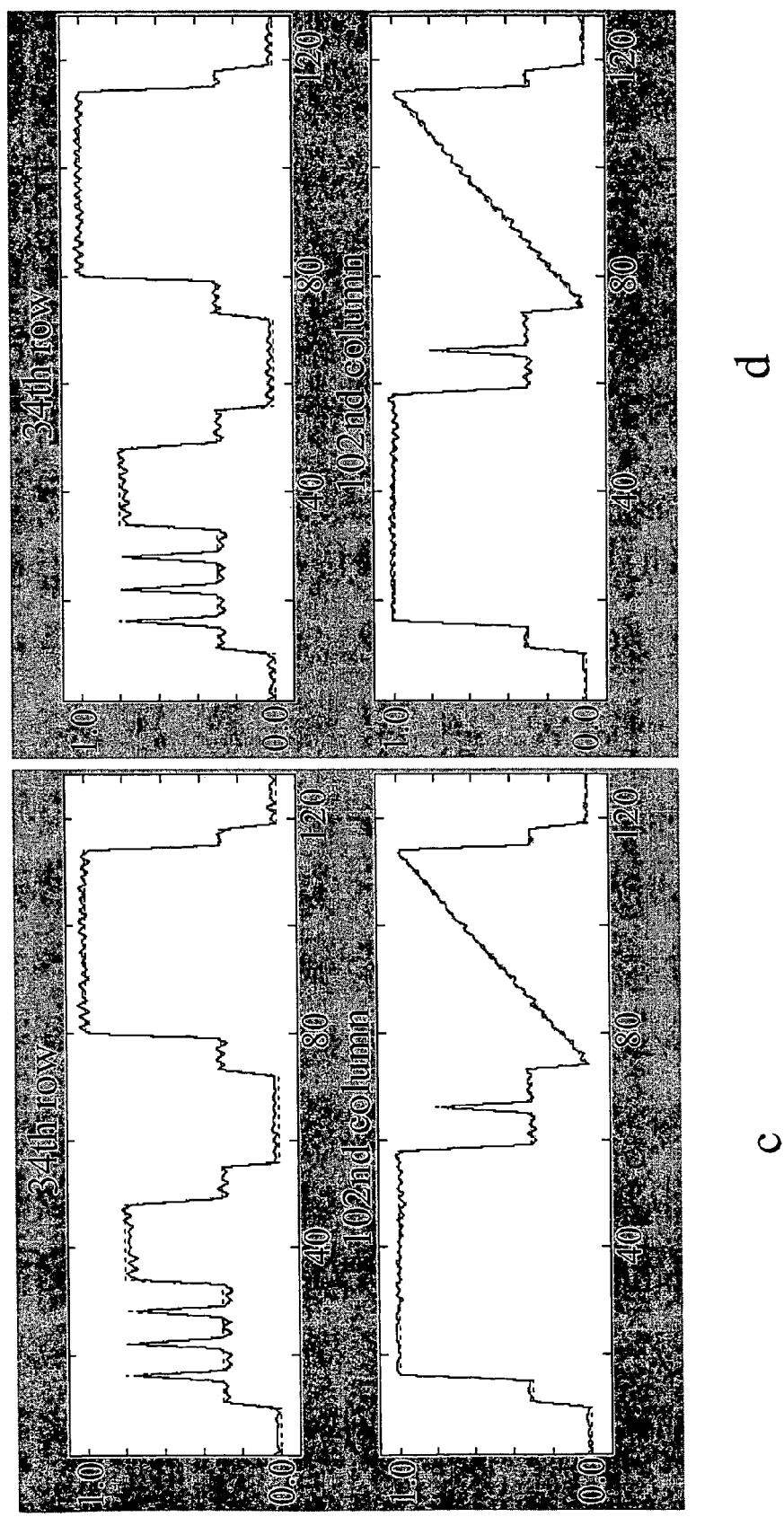
Figure 5:
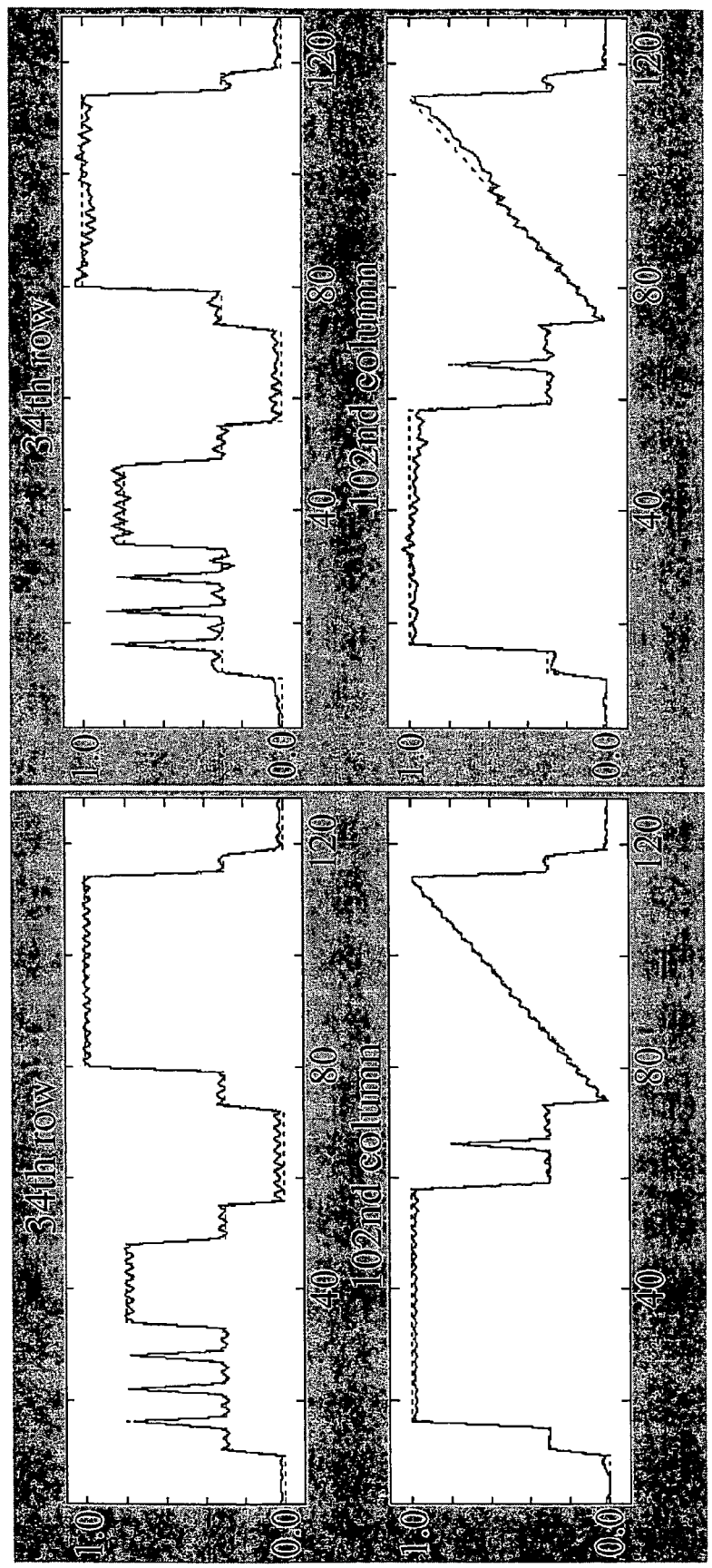
Figure 6:
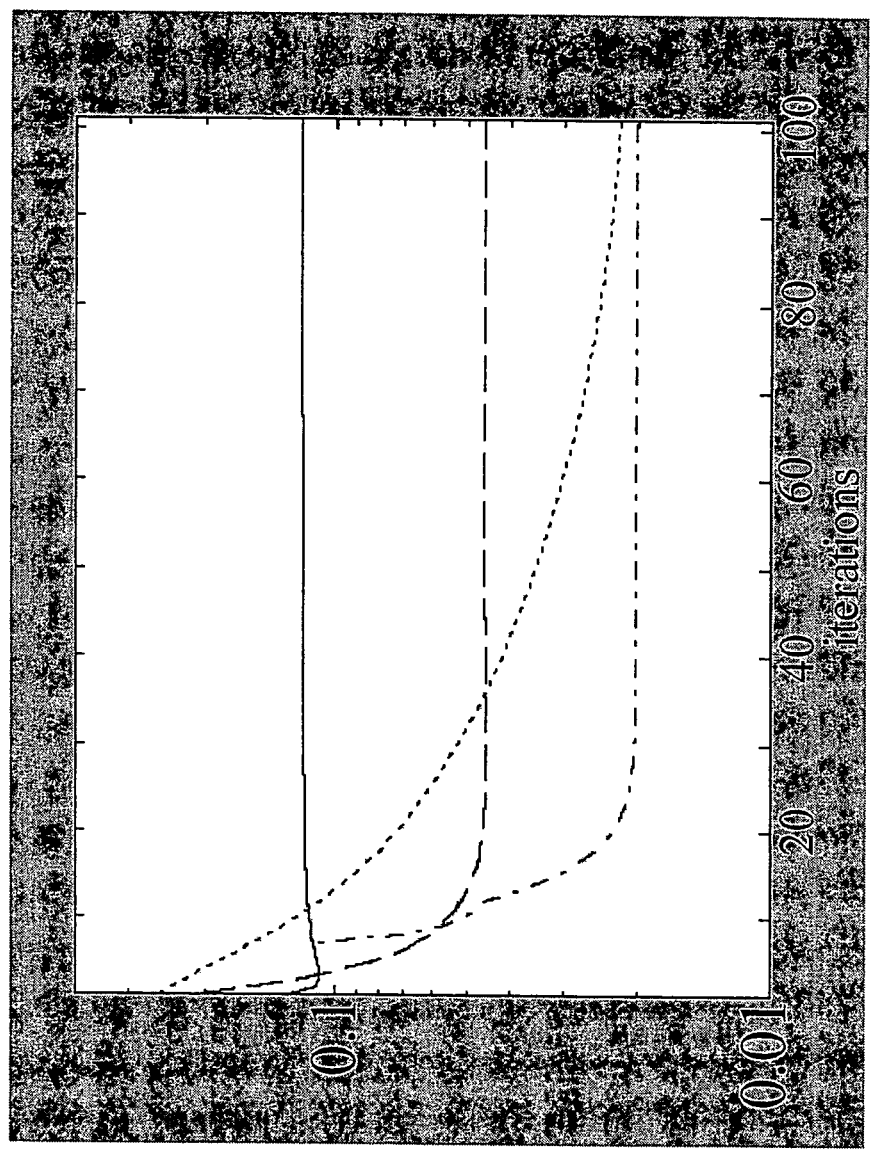
FIG. 6 shows the RMS error of the image with ideal data at each iteration.

FIG. 5 shows the profiles at the 34th row and the 102nd column of the images (indicated by the dashed lines in FIG. 4) with ideal data reconstructed using the basic INNG algorithm with s=8 after 30 iterations (a) and that after 101 iterations (b), the facilitated INNG algorithm after 30 total iterations (c), the BINNG algorithm with ($d_2$, $d_4$, $d_8$)=(0.01, 0.01, 0.001) (d), the conventional gridding algorithm with Voronoi DCF (e), and the BURS algorithm with p=0.8 (f). As can be seen, FIGS. 5(b)-(e) show little deviation from the original profiles. In FIG. 5(a), the high spatial frequency components are not sufficiently reproduced. The BURS algorithm reconstructed the image with the least RMS error when p=0.8 of all the nine tested values of p. Although no significant profile distortions were observed in FIG. 5(f), the deviations from the original profiles are larger than those of FIGS. 5(b)-(e). FIG. 6 shows the RMS error of the image with ideal data at each iteration in the basic INNG algorithm (the solid, dashed and dotted lines correspond to s=2, 4 and 8, respectively) and facilitated INNG algorithm (the dash-dot line). The same types of lines are used in FIG. 7. Note that FIG. 6 is log-scaled. As FIG. 6 shows, in the basic INNG algorithm with s=2, the RMS error decreases for the first few iterations and then increases although the rate of increase is decreased with iterations. Similarly, when s=4, the RMS error is decreased to approximately 30 iterations and then remains almost unchanged even though iteration progresses. When s=8, the RMS error is monotonically decreased at least until the 101st iteration. As expected, the larger s is, the smaller the RMS error becomes after a sufficient number of iterations. The RMS error of the facilitated INNG algorithm is decreased rapidly compared with that of the basic INNG algorithm when s=8 and becomes almost constant after 30 iterations.

The RMS error of each algorithm with ideal data is summarized in Table 1 where the number after the # sign represents the total number of iterations performed (also in Tables 2 and 3). For example, s=2 (#7) denotes that seven iterations were performed when s=2. The number of iterations indicated in the BINNG algorithm is the average number of iterations for all 25 blocks for the specified s (this is also the case in Tables 2 and 3). As seen in Table 1, the INNG/BINNG algorithms involving s=8 reconstruct the images with comparable or even smaller RMS errors than the conventional gridding algorithm with Voronoi DCF and the BURS algorithm. The RMS energy of the original numerical phantom was 48.581× $10^{-2}$.

Figure 7:
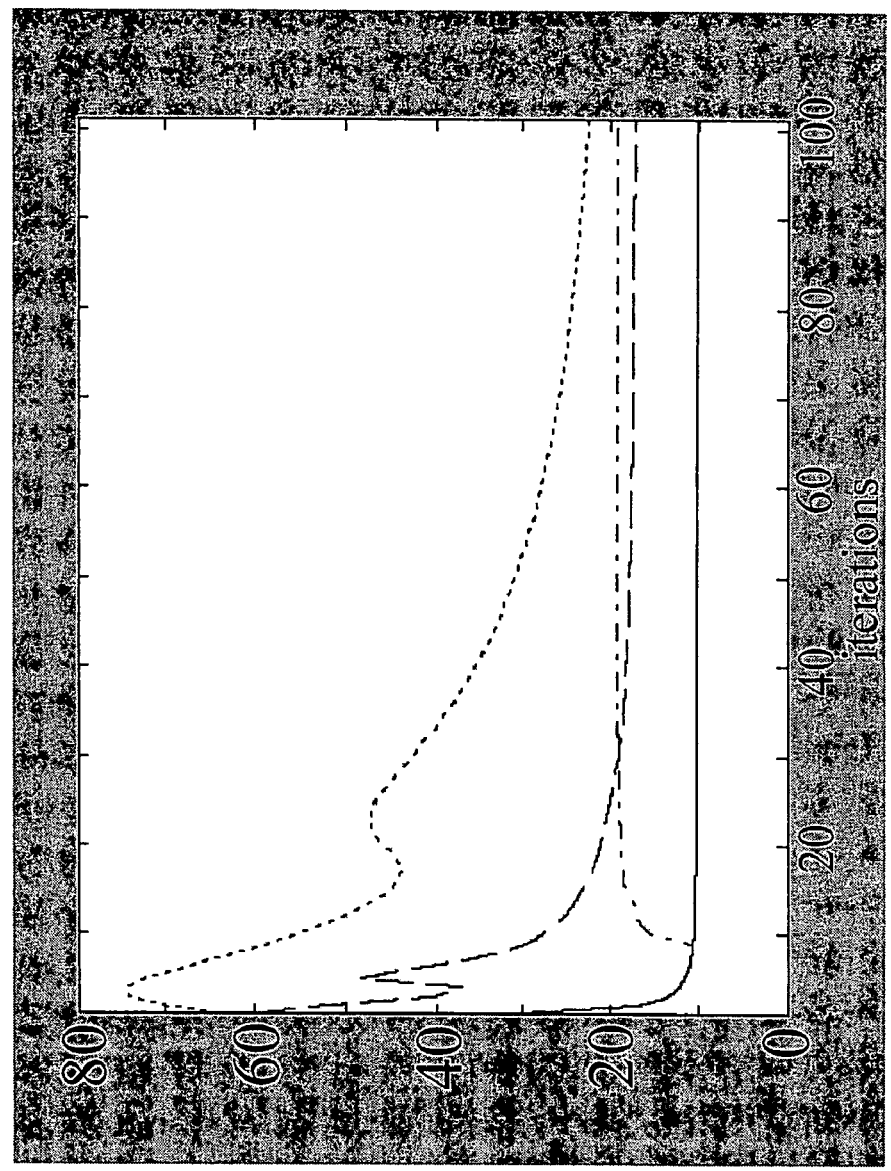
FIG. 7 shows the measured SNR of the image with noisy data at each iteration.

FIG. 7 shows the measured image SNR at each iteration in the basic and facilitated INNG algorithms. The image SNR is transiently increased for initial parts of the iterations when s=4 and 8. However, after certain points, the image SNR is monotonically decreased with iterations for all the basic INNG algorithms. Furthermore, the rate of decrease becomes more insignificant with iterations. In the facilitated INNG algorithm, the image SNR becomes almost constant after approximately 30 iterations.

Table 2 summarizes the RMS error and the measured image SNR of each algorithm with noisy data. For noisy data, the BURS algorithm reconstructed the image with the least RMS error when p=0.5 of all the nine tested values of p. In Table 2, the images reconstructed using the facilitated INNG and BINNG algorithms involving s=8, show equivalent RMS errors and image SNR to that of the conventional gridding algorithm with Voronoi DCF.

The image reconstructed using the basic INNG algorithm with s=8 after 30 iterations has the smallest RMS error and the largest image SNR in Table 2. However, as is evident from FIG. 7, this image is still in a transient stage of reconstruction in the basic INNG algorithm with s=8.

The INNG/BINNG algorithms described above lead to accurate image reconstruction when s is sufficiently large. The RMS errors of the facilitated INNG and BINNG algorithms involving s=8 are comparable to those of conventional gridding with Voronoi DCF, which has been shown to reconstruct images with quite small errors.

Although the BURS algorithm has been reported to be quite accurate, the deviation observed in FIG. 5(f) is more pronounced than those seen in FIGS. 5(b)-(e). Since the BURS algorithm employs SVD matrix inversion, it is often unstable for over-sampled regions, even if the k-space data are ideal (This is also true for under-sampled regions. However, the sampling schemes employed in the context of the disclosed inventive methods satisfy the Nyquist criterion for the entire k-space.). Spiral trajectories usually sample the central k-space region more densely than the outer regions, which can result in relatively large gridding errors in the lower frequency regions. Although SVD regularization is effective for reducing these artifacts, it is difficult to determine appropriate regularization schemes before the algorithm is started. For this reason, the quality of the BURS algorithm is not as good as that of other comparable algorithms for the examples presented herein.

Equation [7] suggests that the image reconstructed using the basic INNG algorithm can be regarded as the summation of the image originated from the ideal signal components $I_{m,ideal}(x)$ and the image from the residual imperfections $n_m(x)$. In other words, as iteration progresses, the RMS energy of $[I_{m,ideal}(x)-I(x)]$ is continuously decreased toward zero, and that of $n_m(x)$ is increased. Thus, the initial descending part of each RMS error curve in FIG. 6 predominantly reflects the RMS energy of $[I_{m,ideal}(x)-I(x)]$, and the RMS energy of nm(x) becomes increasingly dominant in the RMS error with iterations. However, as mentioned earlier, the increase rate of the RMS energy of $n_m(x)$ is reduced as the iteration progresses, since Eq.[6] holds for $n_m(x)$ as well. This fact is also suggested from FIG. 6. As is noted in FIG. 7, the measured image SNR is almost unchanged for s=2 and 4 after a certain number of iterations. These results suggest that the image quality does not significantly change even if iterations unnecessarily continue from initial noise-corrupted data.

Table 2 shows that both RMS error and image SNR of the basic INNG algorithm with s=4 are equivalent to those of the facilitated INNG/BINNG algorithms involving s=8. A comparison between FIGS. 5(a) and 5(b) suggests that a larger number of iterations are necessary for the higher frequency components to appear in the image for the basic INNG algorithm. This is also the case with noisy data. The image reconstructed using the basic INNG algorithm with s=8 after 30 iterations has the least RMS error and the highest SNR in Table 2. However, fine structures may not be sufficiently reproduced. The expression of the fine structures in the image may require more iterations, although the image SNR becomes lower, as shown in FIG. 7. It should be noted that the RMS error is one of many metrics used to evaluate the image quality when the reference image is available.

As can be seen in FIG. 6, the facilitated INNG algorithm substantially reduces the number of iterations from the basic INNG algorithm for the same target scaling factor s. In the facilitated INNG algorithm, intermediate images are used as starting images for the basic INNG algorithm with the next larger scaling factor, as shown in FIG. 2. As these images are only rough estimates for the next basic INNG algorithm, the number of iterations for the intermediate INNG algorithms could be reduced to further improve the computational efficiency. The employed stopping criteria $(d_2, d_4)=(0.01, 0.01)$ are relatively relaxed. The numbers of iterations performed under this condition were 7 and 5 for s=2 and 4, respectively, for the ideal data. However, FIG. 6 suggests that seven iterations for s=2 may be unnecessary as the RMS error is minimized before 7th iteration when s=2. These examples suggest that the stopping criteria used to obtain intermediate images should be as relaxed as possible to avoid unnecessary computations, although it is difficult to determine the optimal stopping criteria in advance.

The BINNG algorithm is useful when the target rescaled matrix is quite large and hence it is computationally impractical to perform a 2D-FFT. The BINNG algorithm was applied to the same simulated data used for the INNG algorithms in order to compare both algorithms. The image quality of the BINNG algorithm is comparable to that of the INNG algorithms, as seen in FIG. 5(d). The basic concept behind the BINNG algorithm is to recover the data that satisfy the constraints (i) and (ii) in each k-space block region. Therefore, the size of the blocks can be determined without any restriction. However, it would be desirable to have the central region of k-space covered by one complete block to avoid the data discontinuity between the blocks near the k-space center. In our examples, we set 5×5 blocks, and each block was processed using sN/4×sN/4 matrices. As this example indicates, it is suggested that odd-by-odd blocks be used in the BINNG algorithm for the reason mentioned above.

Physical Scan

Images were reconstructed from physically acquired spiral data using the methods described above. In one exemplary experiment, an axial brain image was scanned from an asymptomatic volunteer. The acquisition was performed using a 1.5-Tesla Siemens Sonata scanner (Siemens Medical Solutions, Erlangen, Germany). All procedures were performed under an institutional review board-approved protocol for volunteer scanning.

The followings acquisition parameters were used: 20 spiral interleaves; FOV 240×240 mm; slice thickness 10 mm; spiral readout time 16.0 ms; and TE/TR=6.0/33.0 ms. 1-4-6-4-1 binomial pulses were used for spatial-spectral excitation. The total flip angle for on-resonance spins was 16°.

The images were reconstructed using basic INNG, facilitated INNG, BINNG, a conventional gridding algorithm with ADF and with Voronoi DCF, and BURS with p=0.8. In the basic INNG algorithm, s=2 and $d_2$=0.001. In the facilitated INNG algorithm, s=2→4 and $(d_2, d_4)=(0.01, 0.001)$. In the BINNG algorithm, the acquired k-space was partitioned into 5×5 blocks. Each block was processed by the facilitated INNG algorithm using sN/4×sN/4 rescaled matrices with s=2→4→8 and $(d_2, d_4, d_8)=(0.01, 0.01, 0.003)$.

For each reconstructed image, the image SNR $(S_{im}/N_{im})$ was measured where $S_{im}$ and $N_{im}$ were the mean signal amplitude of the 15×15 pixels in the white matter and the SD of 50×50 pixels in the background, respectively. Their locations are indicated by the squares in FIG. 8(a).

Figure 8:
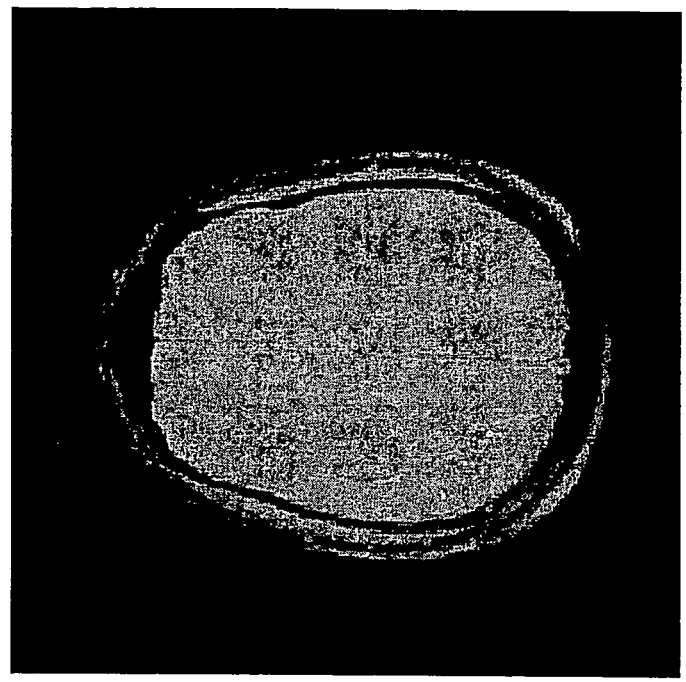
FIG. 8 shows reconstructed in-vivo brain images.
Figure 8:
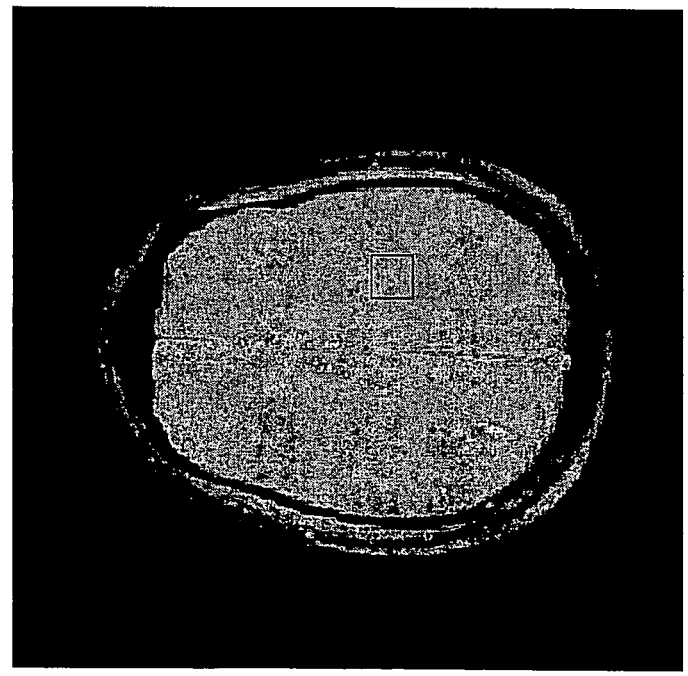
Figure 8:
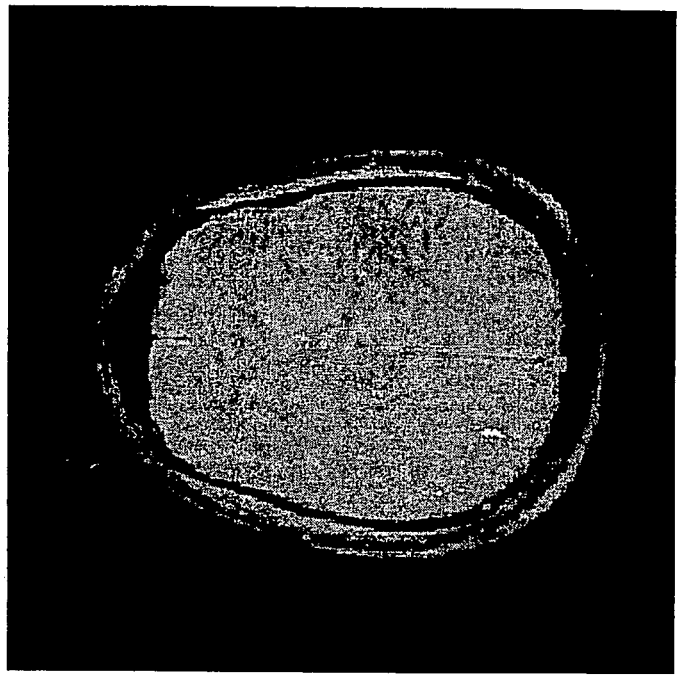
Figure 8:
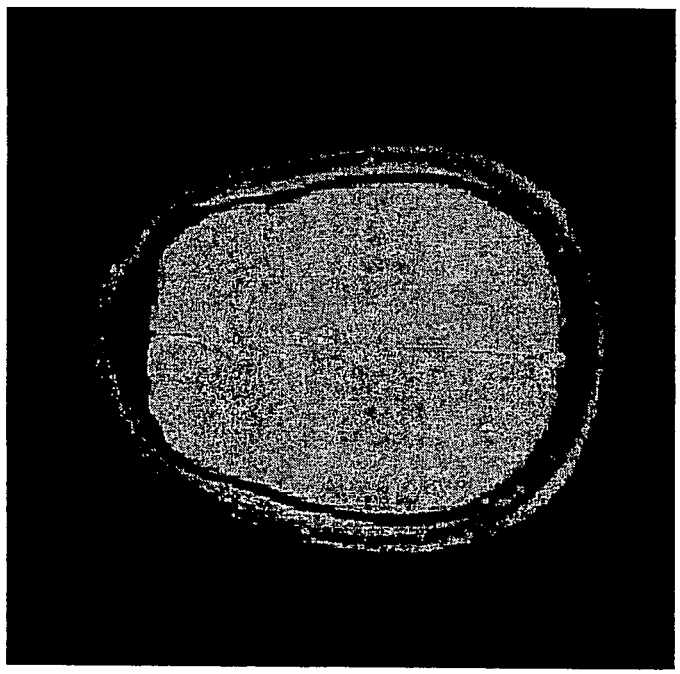

FIG. 8 shows the in-vivo brain images reconstructed using the facilitated INNG algorithm (a), the BINNG algorithm (b), the conventional gridding algorithm with Voronoi DCF (c) and the BURS algorithm with p=0.8 (d). There are visually no significant differences among these images. Table 3 summarizes the measured image SNR for each reconstructed image. There is no significant image SNR difference among the images shown in FIG. 8. The SNR of the basic INNG algorithm with s=2 is equivalent to that of the conventional gridding with ADF, and the SNR of these two algorithms are approximately 60% of those of the other four algorithms shown in Table 3.

The maximum scaling factors used to reconstruct the images of FIGS. 8(a) and 8(b) were 4 and 8, respectively. However, there are no visually significant differences between these two images. This example suggests that scaling factor 4 would be sufficient for typical image contents as was also indicated by the results of the noisy simulated data shown in Table 2.

The conventional gridding is robust to noise because convolution essentially averages the local k-space data. This is generally true independently of the type of DCF. However, as indicated in Table 3, the image SNR of the conventional gridding with ADF is lower than those of other algorithms whose images are shown in FIG. 8. This resulted from the non-negligible profile distortions of the image reconstructed using the conventional gridding with ADF. In other words, the signal amplitudes of the scanned object regions were over-compensated in the post-compensation step; hence the signal $S_{im}$ was measured low in this image relative to that in other images.

The INNG/BINNG method of the invention is quite simple and does not require complicated procedures to compute DCFs, while reconstructing images with small degrees of error. One primary drawback of the INNG/BINNG algorithms is that it is difficult to set appropriate stopping criteria for iterations. Exemplary stopping criteria employed herein are based on the metric d in Eq.[8]. Although the value of d is monotonically decreased for a specific s, it is quite difficult to determine in advance the stopping criteria for d. For example, when an image was reconstructed from the in-vivo data using the facilitated INNG algorithm, we set the stopping criteria $(d_2, d_4)=(0.01, 0.001)$. These values were determined based on the simulation experiments. As FIG. 7 shows, the rate of image SNR change becomes smaller as iteration progresses. This fact suggests that stopping criteria can be alternatively devised by utilizing the rate of the image SNR change. However, it would be still difficult to set appropriate values to stop the iterations before the algorithms are started. In practice, the number of iterations to be performed may need to be optimized empirically.

In the conventional gridding and the BURS algorithms, interpolation coefficients can be calculated once the coordinates of the sampled points are given. In other words, the interpolation coefficients can be pre-calculated and stored and subsequently multiplied by k-space data after the data are acquired. This process facilitates the reconstruction speed after data acquisition. Generally, the procedures of the INNG/

BINNG algorithms are performed after the k-space data are acquired, since the they employ iterations.

According to another practice, partial Fourier reconstruction techniques can be employed to reduce scan time in spiral MR sampling schemes. This technique employs variable-density spiral (VDS) trajectories so that the Nyquist criterion is satisfied in the central region of the k-space, whereas the outer regions of k-space are undersampled. The projections onto convex sets (POCS) method is used in the reconstruction. The disclosed partial Fourier spiral reconstruction (PFSR) technique permits reduced scan time when compared with the conventional spiral imaging.

Spiral imaging is a rapid MRI data acquisition technique that has gained considerable popularity, particularly in dynamic imaging, in the past few years. Although its scan time is usually a fraction of a second, artifacts due to sufficiently rapid motion are often observable. In the technique disclosed herein, a rectilinear partial Fourier reconstruction technique has been extended to image reconstruction from undersampled spiral k-space data sets, wherein the k-space data are incompletely sampled to further reduce the scan time of spiral imaging.

The PFSR technique applies the projection onto convex sets (POCS) method developed in rectilinear sampling schemes (3), to spiral sampling schemes. There are two constraints that are imposed on the data set at each iteration in the POCS method: (i) phase constraint in the image domain, (ii) data-consistency constraint in the k-space domain. To apply this method to spiral sampling schemes, the resealing matrix reconstruction algorithm (the equivalent algorithm was proposed as the 'next neighbor re-gridding algorithm') has been modified. The first step of this algorithm is to create an estimated image phase map $\Phi_e$ from the low-resolution image reconstructed from the central k-space data. The next step is to perform iterative procedures to impose the two constraints on the acquired data set.

The proposed PFSR algorithm follows essentially the flow of the basic INNG algorithm described above with reference to FIG. 1, except that a phase constraint is imposed on the image (c) of FIG. 1. The original target grid is an N×N matrix. K-space data are distributed into a larger rescaled matrix by a factor of s (=2m), where m is a small positive integer (FIG. 1(a)). The location of each datum in the large rescaled matrix is determined by multiplying the original k-space coordinate by s and then rounding the rescaled coordinate off to the nearest target rectilinear grid location. If more than one datum share the same matrix coordinate, the mean value is stored. An Inverse Fourier Transform (IFT) is performed on matrix (a), leading to image matrix (b). The intermediate reconstructed image appears in the central N×N matrix in (b). The phase constraint is imposed on the central N×N image region. That is, $$I_{new}=|I_{old}|*\exp(i\Phi_e). \quad [9]$$

where $I_{old}$ and $I_{new}$ represent the image values at each pixel in the central N×N region of (b) before and after the phase constraint, respectively. The region outside of the central N×N matrix is set to zeros, resulting in (c). An FT is performed on (c), leading to (d) which is an estimate of the phase-constrained raw data. Then, the data-consistency constraint is imposed on this data matrix, i.e., the data where the original data exist are replaced by the original data values, as shown in (e). An IFT is performed on (e). The updated reconstructed image again appears in the central N×N matrix in (b). The procedures (b)→(c)→(d)→(e)→(b) (surrounded by dashed lines in FIG. 1) are repeated until the difference between the updated image and the image at the previous iteration becomes sufficiently small.

In-vivo spiral imaging experiments were performed in the manner described above to demonstrate the performance of the proposed algorithm. Head images were scanned from a healthy volunteer using a 10 interleaved VDS. Each spiral trajectory has 4.5 turns in the central portion (radius 30% of $k_{max}$: the Nyquist criterion is satisfied in this region) and 5.25 turns in the outer regions of k-space (the Nyquist criterion is violated). TE/TR=6.0/31.0 ms, the slice thickness 10 mm. For image reconstruction N=256 and s=4. The PFSR algorithm was performed with 50 iterations. A conventional matrix resealing algorithm was also used as a standard reconstruction method for comparison. A comparative data set was also acquired with 20 interleaved constant density spiral trajectories (7.5 turns each). In the latter trajectory, the Nyquist criterion is satisfied for the entire k-space.

Figure 9:
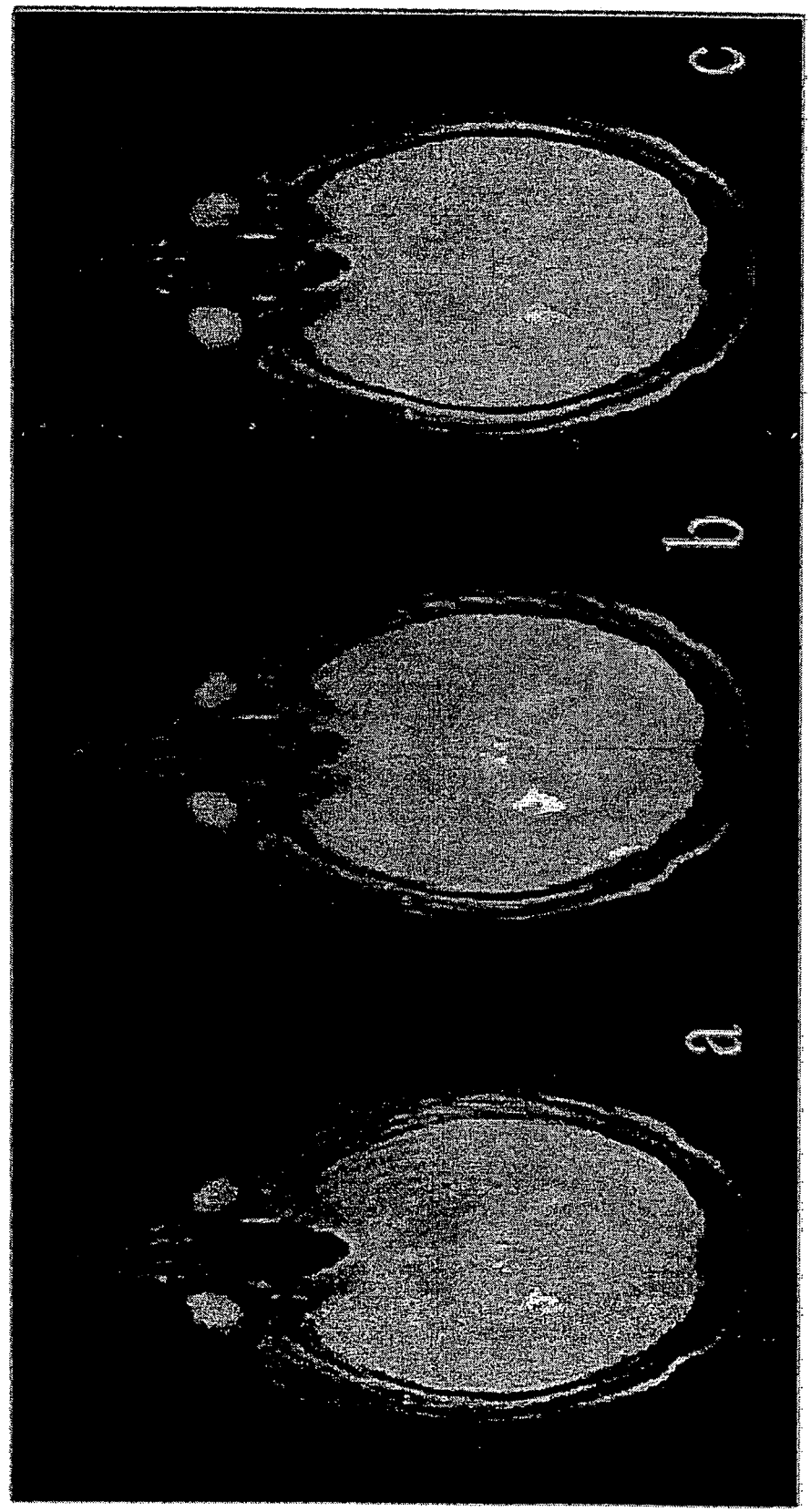
FIG. 9 shows reconstructed images: (a) standard reconstruction from reduced data, (b) the PFSR algorithm from reduced data, and (c) the standard reconstruction from full data.

FIG. 9 shows the reconstructed images a, b: via reduced data sets ((a) via the matrix resealing algorithm, (b) via the new PFSR algorithm, (c) via a full data set). As observed, (a) is affected by aliasing artifacts. The aliasing artifacts are reduced in (b) without loss of spatial resolution.

The reconstructed image quality in the conventional rectilinear partial Fourier reconstruction with POCS has been shown to depend on the estimated phase, which is also the case with the PFSR algorithm discussed above. The variable-density spiral can sample the central region of k-space with little additional acquisition time as compared with a constant-density spiral. In other words, the estimated phase map can be efficiently obtained with the use of a VDS in the PFSR technique. Constraint (ii) is difficult to apply when k-space data are sampled non-uniformly. However, the PFSR algorithm can overcome this difficulty since it uses large rescaled (i.e., rectilinear K-space) matrices. Both constraints (i) and (ii) can be readily imposed on the data set at each of the iterations depicted in FIG. 1 with the phase constraint imposed in (c). The PFSR technique permits image reconstruction with reduced artifacts from undersampled spiral data sets, thereby enabling further reductions in scan time in spiral imaging.

According to another practice, a Block Regional Off-Resonance Correction (BRORC) can be employed as a fast and effective deblurring method for spiral imaging. Spiral acquisition techniques have advantages over other k-space trajectories because of their short scan time and insensitivity to flow artifacts, but suffer from blurring artifacts due to off-resonance effects. A frequency-segmented off-resonance correction (FSORC) method is commonly used to combat off-resonance effects and reconstruct a deblurred image. In this algorithm, several k-space data sets are first created by demodulating the original data by several different frequencies; separate images are reconstructed from each demodulated k-space data set via 2D inverse Fourier Transform (IFT). Deblurred image regions are selected from the reconstructed images under guidance of a frequency field map. The final reconstructed image with off-resonance correction is created by combining all deblurred regions selected from the appropriate demodulated image. The computational burden of FSORC is proportional to the number of demodulation frequencies used since the fast Fourier transform (FFT) is performed on each demodulated k-space data set. Hence, FSORC is often computationally intensive, particularly when a wide range of off-resonance frequencies exists across a scanned object.

Other off-resonance correction algorithms with improved computational efficiency use, for example, a linear field map which, however, can only correct for linear components of off-resonance frequency variation. Therefore, residual frequency variations that deviate from the linear variation must be corrected with FSORC; hence several FFTs are usually required. In another conventional method called multi-frequency interpolation (MFI), images are reconstructed using a reduced number of demodulation frequencies. Images requiring other demodulation frequencies are estimated from the limited set of demodulated/reconstructed images via interpolation. In MFI, the interpolation coefficients need to be pre-calculated. The total number of demodulation frequencies used in MFI is typically one-fourth to one-third that of the conventional FSORC. Image domain deconvolution methods approximate the spiral time evolution function as a quadratic function with respect to a k-space radius. This enables correction via one-dimensional deconvolution (along the x and y directions) in the image domain since separable demodulation functions along the x and y directions can be formed. However, image quality degradations beyond those associated with FSORC may result when the difference between the actual spiral time evolution function and the approximated quadratic function cannot be ignored.

Accordingly, to improve image reconstruction, a novel fast off-resonance correction method, (a.k.a., 'Block regional off-resonance correction (BRORC)') is presented. In this method, off-resonance correction proceeds block-by-block through the reconstructed image, and FFTs are performed on matrices that are smaller than the full image matrix. Although the computational cost of BRORC relative to that of FSORC depends on the selection of the parameter values in these algorithms, the BRORC is usually computationally more efficient than FSORC. Furthermore, greater reduction of the computational costs can be expected in BRORC if only particular regions of the image need to be deblurred.

Figure 10:
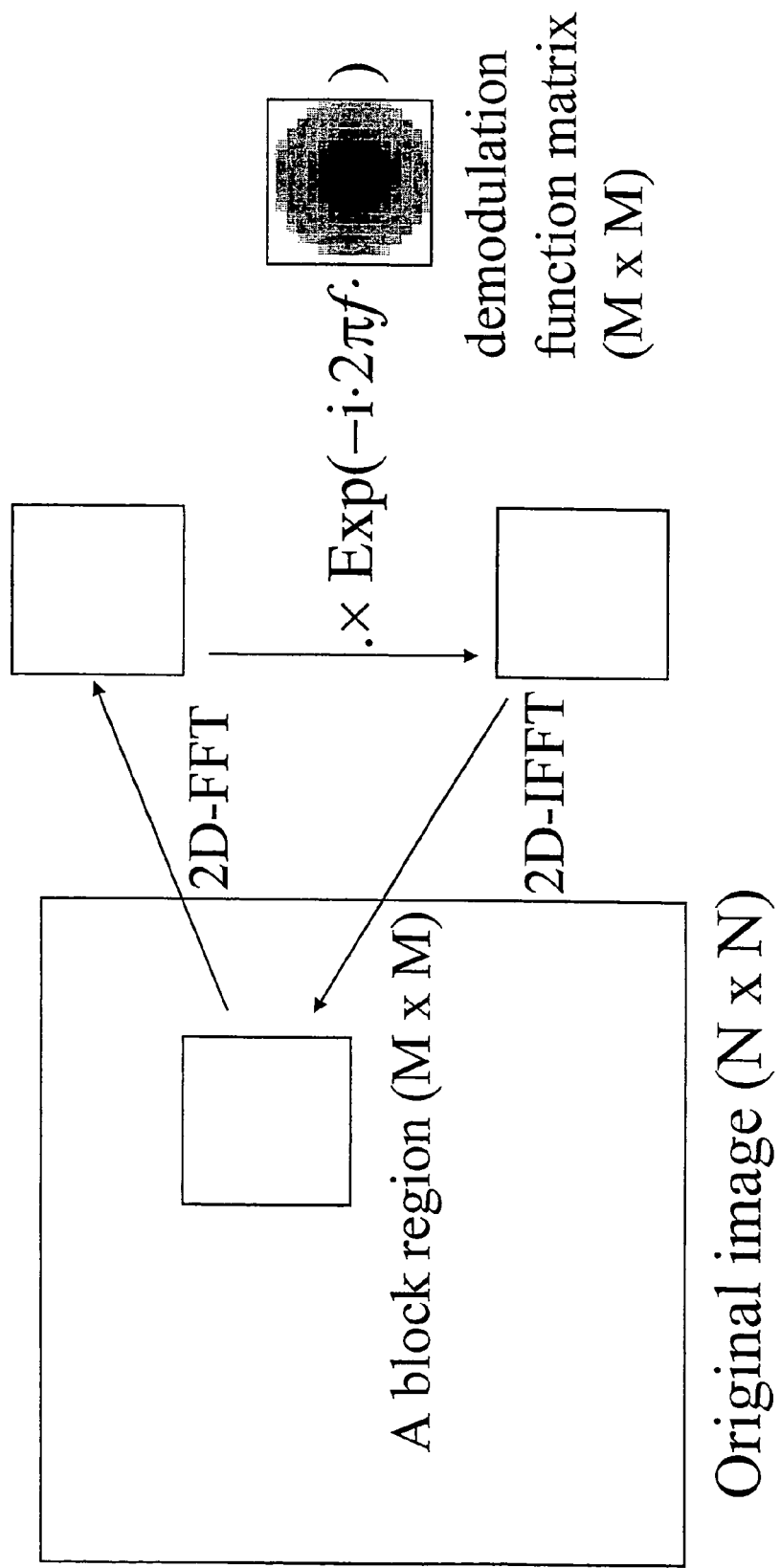
FIG. 10 shows an exemplary block diagram of Block Regional Off-Resonance Correction (BRORC)

Referring now to FIG. 10, a block diagram of BRORC is shown having an original image matrix size of N×N (e.g., 256×256). The first step of the BRORC is to extract a small block region M×M. For convenience, M is typically chosen to be a number expressed as a power of 2 (e.g., 16, 32), though this need not be the case. A 2D-FFT is performed on the M×M image matrix. The obtained M×M Fourier data is to be frequency demodulated. The demodulation function matrix for the M×M data must also be M×M in size. This matrix can be obtained by N/M-fold decimation of the original N×N demodulation function matrix. Regions near the four corners of the M×M demodulation function matrix should be handled carefully. Normally, after the acquired spiral k-space data are gridded onto an N×N grid, there are no data outside of the inscribed circle (radius N/2 in Cartesian step). These regions are usually set to zeros in the N×N data matrix before frequency demodulation is performed. However, in the M×M Fourier data matrix, all the M×M matrix elements usually have non-zero data values. If the corresponding M×M demodulation frequency matrix has zero values in the regions near the four corners, artifacts originating from the inaccurately demodulated high spatial frequency components may appear after demodulation. Therefore, when the M×M demodulation function matrix is formed, the regions outside the inscribed circle are filled with the maximum readout time values, thereby effectively performing N/M-fold decimation without introducing such artifacts.

The demodulation frequency ('f' indicated in FIG. 10) is determined from the central region of the M×M sub-image matrix in the frequency field map. In practice, the mean off-resonance frequency of the central rM×rM pixels (0<r≦1, and r is typically 0.5.) in the M×M phase image matrix, is used as the demodulation frequency 'f'. After frequency demodulation, the M×M k-space data is subsequently 2D-inverse Fourier transformed. Since the outer regions of the obtained M×M image matrix may exhibit artifacts, only the central rM×rM pixels of the M×M deblurred image matrix are kept for the final reconstructed image. This procedure is repeated until the entire scanned object is deblurred. However, as is evident from the BRORC block diagram, it is also possible to only deblur particular regions of the image. This is not possible with the conventional FSORC.

In-vivo spiral images were acquired to facilitate comparison of FSORC and BRORC. All acquisitions were performed using a 1.5-Tesla Siemens Sonata scanner (Siemens Medical Solutions, Erlangen, Germany). Axial brain images and cardiac images were acquired from asymptomatic volunteers using a quadrature head coil and four-element phased array surface coils, respectively. All procedures were performed under an institutional review board-approved protocol for volunteer scanning.

For the brain image acquisition, 20 spiral interleaves were used with a field of view (FOV) set to 240×240 mm (resolution 0.94 mm); slice thickness 10 mm; spiral readout time 16.0 ms; and TE/TR=6.0/1000.0 ms.

ECG gating was used during cardiac image acquisition. There were 16 spiral interleaves; FOV 310×310 mm (resolution 1.21 mm); slice thickness 7 mm; spiral readout time 14.0 ms; and TE 6.0 ms.

For both brain and cardiac image acquisitions, T2 prep pulses were used prior to each acquisition and 1-4-6-4-1 binomial pulses were used for spatial-spectral excitation. The total flip angle for on-resonance spins was 64°. For each of the experiments, another image was acquired using the same sequence but with TE=8.0 ms. The frequency field map was obtained from the phase difference between these two reconstructed images.

Head images were reconstructed by gridding k-space data onto a 256×256 Cartesian grid using a modified Block Uniform Resampling (BURS) algorithm. Cardiac images were reconstructed via the matrix resealing algorithm to facilitate the reconstruction from multiple coils' data (The NNG algorithm described above represents an equivalent algorithm). The reconstructed image matrix was 256×256 in size. The cardiac images were reconstructed via the sum-of-squares method from data acquired in each element of the phased-array torso/body coil.

Both FSORC and BRORC were performed on each image data set for comparison. For FSORC, the total number of demodulation frequencies L is normally set to satisfy:

$$L > \frac{4\Delta\omega_{max}T}{\pi}, \quad [10]$$

where $\Delta\omega_{max}$ is the absolute value of the maximum off-resonance frequency (in radians) and T is the spiral readout time. Eq.[10] was derived under the assumption that off-resonance frequency frequencies ranged from $-\Delta\omega_{max}$ to $\Delta\omega_{max}$. In practice, the range of off-resonance frequencies is often asymmetric with respect to the on-resonance frequency (i.e., 0 Hz off-resonance frequency). Thus, L was determined from the following modified equation:

$$L > \frac{2 \cdot 2\pi(f_{max} - f_{min}) \cdot T}{\pi} = 4(f_{max} - f_{min})T, \quad [11]$$

where $f_{max}$ and $f_{min}$ represent the maximum and minimum off-resonance frequencies (in Hz) indicated in the frequency field map. L was set to the minimum integer that fulfilled Eq.[11].

Three combinations of (M, r) were tested for the BRORC algorithm in head imaging trials: (M, r)=(8, 0.25), (16, 0.5), and (32, 0.5). The BRORC algorithm was applied only to object regions in the head image after the background was properly removed by thresholding.

For the BRORC in cardiac imaging trials, (M, r) was set to (32, 0.5). In the cardiac image, only a 160×160 matrix centered on the heart was processed with BRORC.

A comparison of the computational costs of BRORC and FSORC shows that the total number of complex multiplications required for BRORC can be expressed as:

$$B = 2N^2 \log_2 N + s \cdot 2 \cdot 2M^2 \log_2 M + s \cdot M^2, \qquad [12]$$

where s is the total number of rM×rM blocks that cover the scanned object regions. For example, if the entire N×N image matrix is processed with BRORC, $$s = \left(\frac{N}{rM}\right)^2. \qquad [13]$$

In Eq. [12], the first, second, and last terms represent the number of complex multiplications required for an N×N 2D-FFT, those for M×M 2D-FFTs, and those necessary for frequency demodulations for M×M Fourier data, respectively.

On the other hand, the total number of complex multiplications necessary for FSORC can be expressed as:

$$S = L \cdot 2N^2 \log_2 N + L \cdot N^2 = LN^2 (2 \log_2 N + 1), \qquad [14]$$

where the first and second terms express the total number of complex multiplications required for an N×N 2D-FFT and those for frequency demodulations for N×N k-space data.

Figure 11:
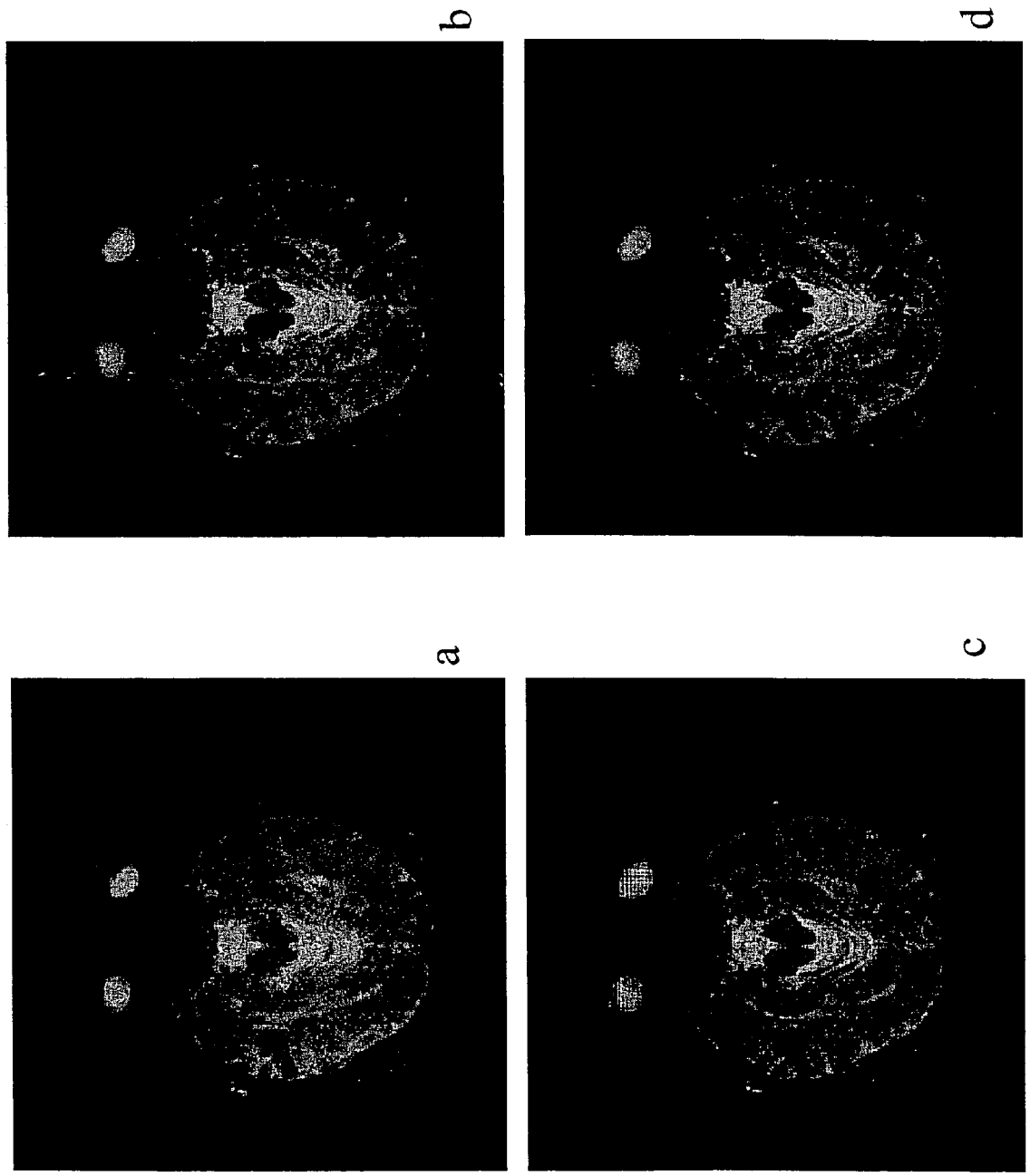
FIG. 11 shows axial brain images.

FIG. 11 shows the axial brain images (a: the image before off-resonance correction; b: the image with FSORC; and c, d: the images with BRORC (c: (M, r)=(8, 0.25); and d: (M, r)=(32, 0.5)). The off-resonance frequencies ranged from −128.2 Hz to 46.7 Hz. Therefore, L was set to 12 in the FSORC according to Eq.[11]. Blurring artifacts can be observed for the anterior parts of the temporal lobes and at the contours of the brain stem in (a). These blurring artifacts are reduced in all images after off-resonance corrections (b)-(d). However, in (c), grid-like artifacts can be seen in some regions, including areas near the eyes (indicated by arrows) and parts of the brain. The quality of the image using BRORC with (M, r)=(16, 0.5) (this image is not shown) is almost equivalent to that of (b) although grid-like artifacts are still apparent in the eyes. The grid-like artifacts are not apparent in (d). Image (d) is visually identical to (b).

Figure 12:
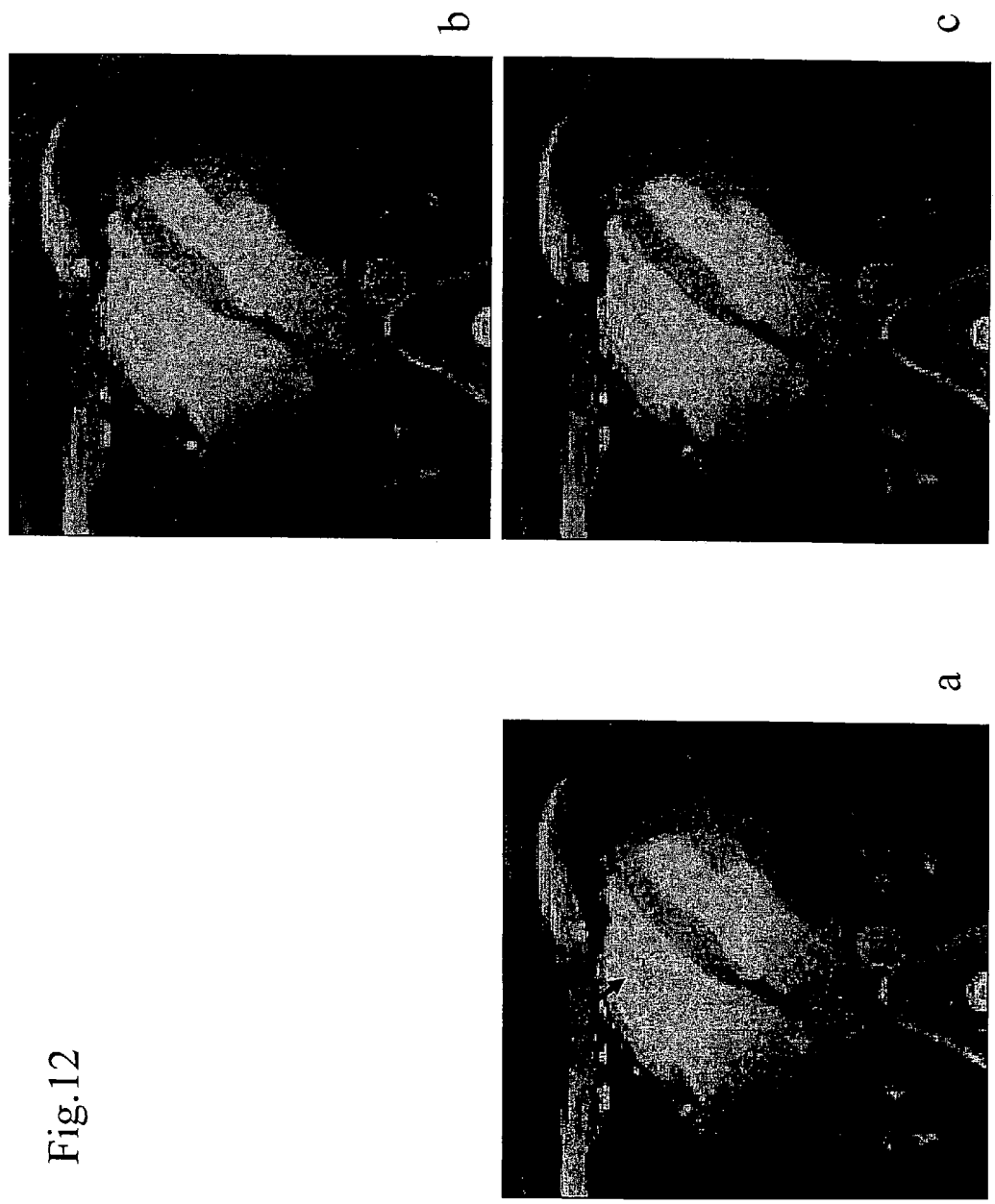
FIG. 12 shows heart images, with a 160×160 matrix centered on the heart being cropped.

FIG. 12 presents the results of the off-resonance correction strategies on cardiac images (a: the image before off-resonance correction; b: the image with FSORC; and c: the image with BRORC (M, r)=(32, 0.5)). The off-resonance frequencies ranged from −139.1 Hz to 124.5 Hz. Hence, L was set to 15 in FSORC according to Eq.[11]. The regions indicated by arrows in (a), the definitions of a papillary muscle and an aorta, are improved in (b) and (c) when compared to the uncorrected image (a). There are no observable difference between (b) and (c).

Table 4 summarizes the total number of complex multiplications required for off-resonance correction in our experiments. Note that BRORC was applied only to the scanned object regions and not to the background in the brain images. The numbers in parentheses in the fourth column in Table 4 indicate the total number of complex multiplications if the entire 256×256 image matrix has to be processed with the same parameters (M, r) for each BRORC algorithm. Also note that in Table 4 the values for FIGS. 12(b) and (c) are those required to process the data from a single coil. The variable s in Eq.[12] (the total number of rM×rM blocks processed using BRORC) is also shown in Table 4. The computational costs of BRORC with (M, r)=(16, 0.5) and BRORC with (M, r)=(32, 0.5) (FIG. 11(d)) relative to that of FSORC with L=12 (FIG. 11(b)) are 21.2% and 27.3%, respectively. The computational cost of BRORC with (M, r)=(32, 0.5) (FIG. 12(c)) relative to that of FSORC with L=15 (FIG. 12(b)) is 19.2%.

The BRORC algorithm is usually computationally more efficient than FSORC even though the comparison depends on the parameter values in Eqs. [12,14]. For example, if r is small, a significant number of M×M 2D-FFT's must be performed with the BRORC. Under these conditions, the BRORC may be computationally more intensive than FSORC. Also, if the range of off-resonance frequency across a scanned object is relatively narrow, i.e. the object is almost on-resonance, the total number of demodulation frequencies L would be small in FSORC. Under these conditions, the relative computational efficiency of BRORC to FSORC may be less than in the examples discussed above. However, the values shown in Table 4 represent the typical computational costs of BRORC for a 256×256 matrix image, and these values are independent of the range of the off-resonance frequency. In other words, when the regions of interest are approximately 40% of the entire FOV as seen in our images, BRORC always requires reduced computational demand than FSORC when L is greater than 4 (because $$\frac{B((M, r, s) = (32, 0.5, 121))}{S(L = 1)} = 3.65 \times 10^6 / 1.11 \times 10^6 \cong 3.3).$$

One way to reduce the computational cost of BRORC is to decrease M, as suggested in Eq.[12]. However, as FIG. 11(c) shows, when M is 8, grid-pattern artifacts can be observed although rM was set to the minimum possible value of 2. Therefore, a better value for M may be at least 16. Another way to improve the computational efficiency in BRORC for a given M is to increase r as it leads to the reduction of the total number of blocks to be processed (s in Eq.[12]). However, r cannot be set too large as grid-like artifacts often remain, as explained below. In the examples described herein, r was set to 0.5 in FIG. 11(d) and FIG. 12(c) when M=32. Sufficient computational advantages were obtained in these BRORC algorithms compared to FSORC, as seen in Table 4.

When an M×M image matrix is extracted to be Fourier transformed, the matrix is abruptly truncated. Thus, artifacts often appear in the outer regions in the M×M image matrix after frequency demodulation. These artifacts are enhanced when the extracted matrix is located in regions with large off-resonance frequencies (in absolute values). To avoid these artifacts in the final reconstructed image, the width of the outer regions to be discarded $$\left(\frac{M - rM}{2}\right)$$

should be reviewed. For example, three pixels were discarded from the edges of the 8×8 matrices in FIG. 11(c). However, grid-like artifacts appeared in the image. This example suggests that three pixels are insufficient to avoid apparent grid-like artifacts. The artifacts can be significantly reduced when four pixels are discarded from the edges of 16×16 matrices (This image is not shown). In FIG. 11(d), eight pixels were discarded from the edges of 32×32 matrices and no evident grid-like artifacts can be observed. Since the width of the spiral blurring PSF is roughly given by (4*ADC time (in sec)*off-resonance frequency in Hz), the maximum blurring extent was estimated as 4·0.016·128=8.2 pixels in the depicted brain images. Although it slightly exceeds eight pixels, the residual artifacts are visually not apparent in FIG. 11(d). Note that FIG. 12(c) in which the same parameter was used as in FIG. 11(d), also shows no grid-like artifacts. In general, the width of the discarded outer region must be increased in areas of larger off-resonance effects to avoid grid-like artifacts.

In BRORC, a constant off-resonance frequency is assumed within each rM×rM block. Since a frequency field map is usually smoothly varying across the FOV, this assumption is, in general, valid. If abrupt frequency transitions occur in some regions, these regions may not be accurately demodulated. For this reason, rM may need to be set small to achieve accurate demodulation. Or, r may need to vary over the image based on the rate of change of the frequency field map. However, as seen in FIG. 11(d) and FIG. 12(c), it appears that rM=16 is an acceptable size in these particular examples to achieve effective off-resonance correction.

Off-resonance effects are proportional to the product of the spiral readout time and the off-resonance frequency. Although the spiral readout time can be varied for each experiment and each clinical application, the spiral readout times used in the experiments described above were typical values for many spiral imaging experiments. The off-resonance frequency ranges are also comparable to those expected in clinical in-vivo imaging experiments. Therefore, the above discussions would be useful when choosing appropriate parameters in the BRORC algorithm. In summary: for a 256×256 image, (i) To achieve effective off-resonance correction, rM=16 is acceptable in practice even though a smaller rM is desirable. (ii) To reduce the computational costs of BRORC, r should not be set too small. (iii) To avoid grid-like artifacts, $$\frac{M - rM}{2} \geq 4$$

is suggested. Based on the above results, (M, r)=(32, 0.5) is likely to be appropriate for BRORC for a 256×256 image in many clinical settings.

Accordingly, the BRORC algorithm is quite simple and it produces reconstructed image quality comparable to that using the FSORC. BRORC is typically computationally several times more efficient than the FSORC with no perceptual difference between the images. Moreover, BRORC can be applied to particular regions of interest to further reduce computational requirements.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

TABLE 1

Algorithm comparison with ideal simulated data

| Algorithm (#: the number of iterations) | RMS error[a] ($\times 10^{-2}$) |
|---|---|
| Basic INNG (s = 2 (#30)) | 11.842 |
| Basic INNG (s = 4 (#30)) | 4.540 |
| Basic INNG (s = 8 (#30)) | 5.266 |
| Basic INNG (s = 8 (#101)) | 2.207 |
| Facilitated INNG (s = 2 (#7) → 4 (#5) → 8 (#18)) | 2.038 |
| Facilitated INNG (s = 2 (#7) → 4 (#5) → 8 (#89)) | 2.025 |
| BINNG of 5 × 5 partitions with ($d_2$, $d_4$, $d_8$) = (0.01, 0.01, 0.005) (s = 2 (#17.7) → 4 (#14.2) → 8 (#5.3)) | 2.315 |
| BINNG of 5 × 5 partitions with ($d_2$, $d_4$, $d_8$) = (0.01, 0.01, 0.001) (s = 2 (#17.7) → 4 (#14.2) → 8 (#69.5)) | 2.032 |
| Conventional gridding with ADF | 7.280 |
| Conventional gridding with Voronoi DCF | 2.241 |
| BURS (δκ = 2.0, Δk = 4.5, p = 0.8) | 2.752 |

[a]The RMS energy of the original numerical phantom is about 48.581 × $10^{-2}$.

TABLE 2

Algorithm comparison with noisy simulated data

| Algorithm (#: the number of iterations) | RMS error[a] ($\times 10^{-2}$) | Image SNR |
|---|---|---|
| Basic INNG (s = 2 (#30)) | 15.070 | 10.2 |
| Basic INNG (s = 4 (#30)) | 8.775 | 19.1 |
| Basic INNG (s = 8 (#30)) | 6.573 | 42.6 |
| Basic INNG (s = 8 (#101)) | 7.356 | 22.5 |
| Facilitated INNG (s = 2 (#9) → 4 (#5) → 8 (#16)) | 8.183 | 19.1 |
| Facilitated INNG (s = 2 (#9) → 4 (#5) → 8 (#87)) | 8.326 | 19.4 |
| BINNG of 5 × 5 partitions with ($d_2$, $d_4$, $d_8$) = (0.01, 0.01, 0.005) (s = 2 (#20.4) → 4 (#16.3) → 8 (#7.3)) | 8.595 | 18.9 |
| BINNG of 5 × 5 partitions with ($d_2$, $d_4$, $d_8$) = (0.01, 0.01, 0.001) (s = 2 (#20.4) → 4 (#16.3) → 8 (#81.2)) | 8.466 | 19.4 |
| Conventional gridding with ADF | 9.991 | 21.8 |
| Conventional gridding with Voronoi DCF | 8.376 | 19.1 |
| BURS (δκ = 2.0, Δk = 4.5, p = 0.5) | 7.635 | 16.8 |

[a]The RMS energy of the original numerical phantom is 48.581 × $10^{-2}$.

TABLE 3

Algorithm comparison with in-vivo data

| Algorithm (#: the number of iterations) | Image SNR |
|---|---|
| Basic INNG with $d_2$ = 0.001 (s = 2 (#35)) | 21.8 |
| Facilitated INNG with ($d_2$, $d_4$) = (0.01, 0.001) (s = 2 (#6) → 4 (#19)) | 37.4 |
| BINNG of 5 × 5 partitions with ($d_2$, $d_4$, $d_8$) = (0.01, 0.01, 0.003) (s = 2 (#24.3) → 4 (#14.1) → 8 (#13.1)) | 36.5 |
| Conventional gridding with ADF | 20.3 |
| Conventional gridding with Voronoi DCF | 36.3 |
| BURS (δκ = 2.0, Δk = 4.5, p = 0.8) | 33.0 |

TABLE 4

Comparison of computational costs of FSORC and BRORC

| Image | Algorithm | Total number of complex multiplications | |
|---|---|---|---|
| FIG. 2(b) | FSORC (L = 12) | $13.37 \times 10^6$ | |
| FIG. 2(c) | BRORC (M, r) = (8, 0.25) | $5.13 \times 10^6$ with $s^a =$ 4904 = 0.299 × (256/2)$^2$ | $(14.68 \times 10^6)^b$ |
| | BRORC (M, r) = (16, 0.5) | $2.84 \times 10^6$ with $s^a =$ 411 = 0.401 × (256/8)$^2$ | $(5.51 \times 10^6)^b$ |
| FIG. 2(d) | BRORC (M, r) = (32, 0.5) | $3.65 \times 10^6$ with $s^a =$ 121 = 0.473 × (256/16)$^2$ | $(6.55 \times 10^6)^b$ |
| FIG. 3(b) | FSORC (L = 15) | $16.71 \times 10^6$ | |
| FIG. 3(c) | BRORC (M, r) = (32, 0.5) | $3.20 \times 10^6$ with $s^a =$ (160/16)$^2$ = 0.391 × (256/16)$^2$ | $(6.55 \times 10^6)^b$ |

What is claimed is:

1. A method, comprising:

controlling a magnetic resonance imaging apparatus to perform actions comprising:

accessing a set of non-rectilinearly sampled k-space data;

creating an estimated image phase map $\phi_e$ from an image reconstructed from central k-space data in the set of non-rectilinearly sampled k-space data;

distributing the set of non-rectilinearly-sampled k-space data on a rectilinear k-space grid without using a k-space gridding interpolation technique to produce a set of distributed data; and repeating steps within the following curly brackets:
{
inverse Fourier transforming the set of distributed data to produce a set of inverse-Fourier transformed data;

updating the set of inverse-Fourier transformed data by setting to zero a selected portion of the inverse-Fourier transformed data;

updating the set of inverse-Fourier transformed data by imposing a phase constraint on a central portion of the set of inverse-Fourier transformed data, where the phase constraint comports with:

$I_{new} = |I_{old}| * \exp(i\phi_e)$ where Inew=image value at a pixel after imposing the phase constraint, and where Iold=image value at a pixel before imposing the phase constraint;

Fourier transforming the set of inverse-Fourier transformed data to produce an updated set of distributed data;

updating the updated set of distributed data at grid points associated with the selected portion of the set of inverse-Fourier transformed data by selectively replacing a current value at a grid point with a value from the set of distributed data;
} until a difference between a current version of the set of inverse-Fourier transformed data and a previous version of the set of inverse-Fourier transformed data is less than a threshold.

2. The method of claim 1, where distributing the set of non-rectilinearly sampled k-space data includes scaling the rectilinear k-space grid by a scaling factor.

3. The method of claim 2, where the scaling factor is a positive integer power of 2.

4. The method of claim 2, including increasing the scaling factor on an iteration of the repeated actions.

* * * * *